(12) United States Patent
Fasoli et al.

(10) Patent No.: US 7,633,829 B2
(45) Date of Patent: *Dec. 15, 2009

(54) HIERARCHICAL DECODING OF DENSE MEMORY ARRAYS USING MULTIPLE LEVELS OF MULTIPLE-HEADED DECODERS

(75) Inventors: Luca G. Fasoli, San Jose, CA (US); Kenneth K. So, Belmont, CA (US)

(73) Assignee: SanDisk 3D LLC, Milpitas, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/876,563

(22) Filed: Oct. 22, 2007

(65) Prior Publication Data

US 2008/0101149 A1    May 1, 2008

Related U.S. Application Data

(63) Continuation of application No. 11/026,470, filed on Dec. 30, 2004, now Pat. No. 7,286,439.

(51) Int. Cl.
 *G11C 7/00* (2006.01)
(52) U.S. Cl. .............................. 365/230.06; 365/230.03
(58) Field of Classification Search ............ 365/230.06, 365/230.03
 See application file for complete search history.

(56) References Cited

U.S. PATENT DOCUMENTS

| | | | | |
|---|---|---|---|---|
| 3,154,636 | A | * | 10/1964 | Schwertz ..................... 348/51 |
| 4,646,266 | A | | 2/1987 | Ovshinsky et al. |
| 5,250,859 | A | * | 10/1993 | Kaplinsky .................... 326/40 |
| 5,285,118 | A | * | 2/1994 | Montegari ................... 326/105 |
| 5,751,012 | A | | 5/1998 | Wolstenholme et al. |
| 5,835,396 | A | | 11/1998 | Zhang |
| 5,963,500 | A | | 10/1999 | Taura et al. |
| 6,034,882 | A | | 3/2000 | Johnson et al. |
| 6,055,180 | A | | 4/2000 | Gudesen et al. |
| 6,185,121 | B1 | | 2/2001 | O'Neill |
| 6,185,122 | B1 | | 2/2001 | Johnson et al. |

(Continued)

OTHER PUBLICATIONS

Naji, Petet K., et al., "A 256kb 3.0V 1T1MTJ Nonvolatile Magnetoresistive RAM," 2001 IEEE ISSCC, Feb. 6, 2001, Paper 7.6, and associated slide handouts, 35 pages.

(Continued)

*Primary Examiner*—Michael T Tran
(74) *Attorney, Agent, or Firm*—Zagorin O'Brien Graham LLP

(57) ABSTRACT

A memory array comprising array lines of first and second types coupled to memory cells includes a first hierarchical decoder circuit for decoding address information and selecting one or more array lines of the first type. The first hierarchical decoder circuit includes at least two hierarchical levels of multi-headed decoder circuits. The first hierarchical decoder circuit may include a first-level decoder circuit for decoding a plurality of address signal inputs and generating a plurality of first-level decoded outputs, a plurality of second-level multi-headed decoder circuits, each respective one coupled to a respective first-level decoded output, each for providing a respective plurality of second-level decoded outputs, and a plurality of third-level multi-headed decoder circuits, each respective one coupled to a respective second-level decoded output, each for providing a respective plurality of third-level decoded outputs coupled to the memory array.

26 Claims, 11 Drawing Sheets

U.S. PATENT DOCUMENTS

| | | | |
|---|---|---|---|
| 6,191,999 B1 | 2/2001 | Fujieda et al. | |
| 6,363,000 B2 | 3/2002 | Perner et al. | |
| 6,407,953 B1 | 6/2002 | Cleeves | |
| 6,420,215 B1 | 7/2002 | Knall et al. | |
| 6,522,594 B1 | 2/2003 | Scheuerlein | |
| 6,545,898 B1 | 4/2003 | Scheuerlein | |
| 6,567,287 B2 | 5/2003 | Scheuerlein | |
| 6,584,034 B1 * | 6/2003 | Hsu et al. | 365/230.05 |
| 6,591,394 B2 | 7/2003 | Lee et al. | |
| 6,618,295 B2 | 9/2003 | Scheuerlein | |
| 6,631,085 B2 | 10/2003 | Kleveland et al. | |
| 6,735,104 B2 | 5/2004 | Scheuerlein | |
| 6,754,746 B1 * | 6/2004 | Leung et al. | 710/100 |
| 6,768,685 B1 | 7/2004 | Scheuerlein | |
| 6,856,572 B2 * | 2/2005 | Scheuerlein et al. | 365/230.06 |
| 6,859,410 B2 * | 2/2005 | Scheuerlein et al. | 365/230.06 |
| 6,876,569 B2 | 4/2005 | Itoh et al. | |
| 6,879,505 B2 * | 4/2005 | Scheuerlein | 365/51 |
| 6,888,750 B2 | 5/2005 | Walker et al. | |
| 6,901,006 B1 | 5/2005 | Kobayashi et al. | |
| 7,002,825 B2 * | 2/2006 | Scheuerlein | 365/51 |
| 7,023,739 B2 | 4/2006 | Chen et al. | |
| 7,106,652 B2 * | 9/2006 | Scheuerlein | 365/230.06 |
| 7,177,169 B2 * | 2/2007 | Scheuerlein | 365/51 |
| 7,177,183 B2 * | 2/2007 | Scheuerlein et al. | 365/185.02 |
| 7,221,588 B2 | 5/2007 | Fasoli et al. | |
| 7,286,439 B2 * | 10/2007 | Fasoli et al. | 365/230.06 |
| 7,298,665 B2 * | 11/2007 | So et al. | 365/230.06 |
| 7,307,268 B2 * | 12/2007 | Scheuerlein | 257/2 |
| 2002/0028541 A1 | 3/2002 | Lee et al. | |
| 2003/0021148 A1 | 1/2003 | Scheuerlein | |
| 2003/0128581 A1 | 7/2003 | Scheuerlein et al. | |
| 2003/0202406 A1 | 10/2003 | Issa | |
| 2003/0214841 A9 | 11/2003 | Scheuerlein et al. | |
| 2004/0100831 A1 | 5/2004 | Knall et al. | |
| 2004/0124466 A1 | 7/2004 | Walker et al. | |
| 2004/0125629 A1 | 7/2004 | Scheuerlein et al. | |
| 2004/0145024 A1 | 7/2004 | Chen et al. | |
| 2004/0190360 A1 | 9/2004 | Scheuerlein | |
| 2005/0128807 A1 | 6/2005 | Chen et al. | |
| 2005/0226049 A1 | 10/2005 | Jeong et al. | |
| 2006/0120200 A1 | 6/2006 | Pochmuller | |

OTHER PUBLICATIONS

Kenneth K. So, Luca G. Fasoli; and Roy E. Scheuerlein, U.S. Appl. No. 11/026,493, filed Dec. 30, 2004.

Compardo, Giovanni, et al., "40-mm.sup.2 3-V-Only 50-MHz 65-Mb 2-b/cell CHE NOR Flash Memory," IEEE Journal of Solid-State Circuits, vol. 35, No. 11, Nov. 2000, pp. 1655-1667.

Motta, Ilaria, et al., "High-Voltage Management in Single-Supply CHE NOR-Type Flash Memories," Proceedings of the IEEE, vol. 91, No. 4, Apr. 2003, pp. 554-568.

Okuda, Takashi and Murotani, Tatsunori, "A Four-Level Storage 4-Gb DRAM," IEEE Journal of Solid-State Circuits, vol. 32, No. 11, Nov. 1997, pp. 1743-1747.

European Search Report mailed Oct. 14, 2008 for EP App. No. 05854312.5, 6 pages.

* cited by examiner

HIERARCHICAL DECODING OF DENSE MEMORY ARRAYS USING MULTIPLE LEVELS OF MULTIPLE-HEADED DECODERS

CROSS-REFERENCE TO RELATED APPLICATION(S)

This application is a continuation application of co-pending U.S. application Ser. No. 11/026,470 by Luca G. Fasoli et al., entitled "Method and Apparatus for Hierarchical Decoding of Dense Memory Arrays Using Multiple Levels of Multiple-Headed Decoders", filed on Dec. 30, 2004, which application is hereby incorporated by reference in its entirety.

This application is related to co-pending U.S. application Ser. No. 11/026,493, filed on Dec. 30, 2004, entitled "Dual-Mode Decoder Circuit, Integrated Circuit Memory Array Incorporating Same, and Related Methods of Operation" by Kenneth K. So, Luca G. Fasoli, and Roy E. Scheuerlein, which application is hereby incorporated by reference in its entirety.

BACKGROUND

1. Field of the Invention

The present invention relates to semiconductor integrated circuits containing memory arrays, and particularly those arrays incorporating array lines having extremely small pitch, and more particularly those having a three-dimensional memory array.

2. Description of the Related Art

Recent developments in semiconductor processing technologies and memory cell technologies have continued to increase the density achieved in integrated circuit memory arrays. For example, certain passive element memory cell arrays may be fabricated having word lines approaching the minimum feature size (F) and minimum feature spacing for the particular word line interconnect layer, and also having bit lines approaching the minimum feature width and minimum feature spacing for the particular bit line interconnect layer. Moreover, three-dimensional memory arrays having more than one plane or level of memory cells have been fabricated implementing such so-called $4F^2$ memory cells on each memory plane. Exemplary three-dimensional memory arrays are described in U.S. Pat. No. 6,034,882 to Johnson, et al., entitled "Vertically Stacked Field Programmable Nonvolatile Memory and Method of Fabrication."

A variety of other memory cell technologies and arrangements are also known. For example, NAND flash and NROM flash EEPROM memory arrays are known to achieve relatively small memory cells. Other small flash EEPROM cells are known which use hot electron programming, such as NROM and floating gate NOR flash memory arrays.

An extremely dense memory array may also be achieved using a NAND-style arrangement, which includes series-connected NAND strings of memory cell devices. Each NAND string of memory cells may include a first block select device which couples one end of the NAND string to a global array line, a plurality of series-connected memory cells, and a second block select device which couples the other end of the NAND string to a bias node associated with the string. A memory array may include a number of memory blocks, with each block including a plurality of NAND strings which share the same word lines. Two block select signals for the block are typically routed to each NAND string of the block.

A basic NAND string is a very efficient structure, capable of achieving a $4F^2$ layout for the incremental transistor memory cell. Density is also improved because the block select lines may be routed in continuous polysilicon stripes across the array block, just like the word lines, without any provision being otherwise required for contacting a block select signal line to some but not all of the block select transistors formed in the NAND strings.

SUMMARY

The area required for implementing decoder circuits for word lines and bit lines has not easily achieved such dramatic reductions as the cell size. Consequently, interfacing the word line decoders and bit line decoders to such tightly spaced word lines and bit lines within such very dense arrays has become extremely difficult, and potentially limits the density of memory arrays otherwise achievable. This is particularly true for decoder structures capable of interfacing with large numbers of array lines having a very small pitch, and particularly if such array lines exist on more than one layer within the memory array, as in a three-dimensional memory array having more than one plane of memory cells.

Such three-dimensional (3D) memories can be extremely dense. Density is achieved by both reduction of the cell memory size (e.g., both a cross-point diode array and a NAND-string memory array can have a memory cell size of $4F^2$) and also by stacking multiple planes of cells, which further reduces the effective cell size by 1/N, where N is the number of memory planes. These very dense 3D structures pose unique problems in building the memory array support circuitry, and particularly the decoding circuitry.

A multi-headed decoder circuit may be used as a final decoder stage in a larger decoder circuit to achieve a net reduction in the number of array lines (e.g., word lines or bit lines) to be decoded by a factor 2*M*N, where M is usually 4 and N is the number of layers of array lines, and the factor of 2 is achieved by driving the array lines alternatively from opposite sides of the array (or top and bottom of the array). These decoded lines, even if reduced in number by a factor of M*N compared to the actual number of array lines, may still be extremely dense. For example, in a 0.13 μm process technology used to fabricate a three-dimensional memory array having 4-layers of bit lines, there are 32 bit lines in a lateral distance of only 2.08 μm (8 bit lines having a pitch of 0.26 μm stacked on each of 4 bit line layers). Using a 16-headed decoder (e.g., on opposite sides of the array), we can reduce the problem of decoding 1 out of 32 bit lines every 2.08 μm, into the problem of decoding 1 "intermediate" line every 2.08 μm.

While quite an improvement, it is sometimes required that such decoded intermediate line not only be decoded but also driven to voltages above the power supply potential, at least for certain modes of operation, such as programming mode. The area demands of level shifting decoder output stages can make interfacing with such tightly pitched high-voltage decoded intermediate lines exceedingly difficult.

The present invention provides an improved decoder structure including at least two hierarchical levels of multi-headed decoder circuits to decode address information and select one or more array lines of a first type. Any desired voltage level shifting may be removed even further from the pitch demands of the actual array lines exiting the memory array.

Such decoder structures may be advantageously used for decoding word lines and/or bit lines in many different types and configurations of memory arrays, including both cross-point arrays of passive element memory cells, such as antifuse memory cells, and NAND string memory arrays, and particularly for memory arrays having more than one memory plane.

For some types of memory arrays, the decoded array line drivers are disposed outside the array and drive array lines into the array. By using hierarchical decoders in accordance with the present invention, only a small final driver is required outside the array. The global control circuitry can fit under the array because fewer signal lines are needed for the interface. This effectively increases the array efficiency.

For some types of block based memory array architectures, such as a three-dimensional NAND string memory array, using hierarchical decoders in accordance with the present invention allows a reduction of the total number of complex level shifters and a simpler decoding structure overall.

As described below, hierarchical decoders in accordance with the present invention include a multi-headed decoder circuit to select one or more of a first group of decoded lines, which are then used to drive another multi-headed decoder circuit to select one or more of a second group of decoded lines, such as actual array lines of the memory array. Such hierarchical decoders may be thought of, at least for some embodiments, as using multi-headed decoder circuits to decode and generate high voltage signals on decoded lines driving other multi-headed decoder structures in a 3D memory array.

In a traditional implementation, decoding and level shifting a single signal line would require more than 8 transistors for every line. By using hierarchical decoding in accordance with the present invention the number of required transistors may be reduced to 3 transistors for every line, plus some common level shifters (which may be implemented "off-pitch").

The invention in several aspects is suitable for integrated circuits having a memory array, for methods for operating such integrated circuits and memory arrays, and for computer readable media encodings of such integrated circuits or memory arrays, all as described herein in greater detail and as set forth in the appended claims.

The foregoing is a summary and thus contains, by necessity, simplifications, generalizations and omissions of detail. Consequently, those skilled in the art will appreciate that the foregoing summary is illustrative only and that it is not intended to be in any way limiting of the invention. Other aspects, inventive features, and advantages of the present invention, as defined solely by the claims, may be apparent from the detailed description set forth below.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DETAILED DESCRIPTION

Figure 1:
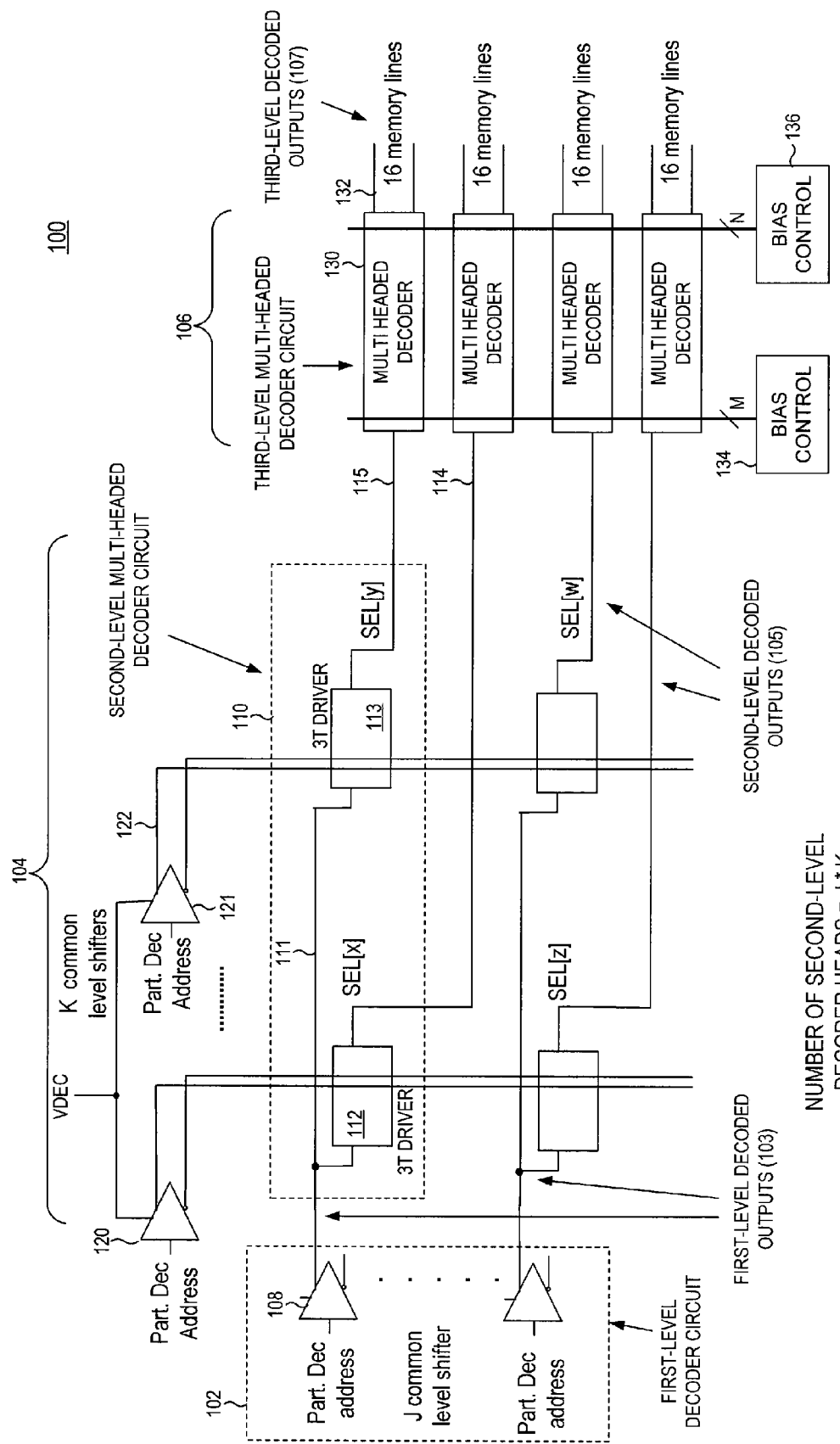
FIG. 1 is a block diagram of a hierarchical decoder circuit in accordance with some embodiments of the present invention.

An exemplary hierarchical decoder incorporating at least two hierarchical multi-headed decoder circuits is shown in FIG. 1, which shows a hierarchical multi-level multi-headed decoder circuit 100. A first-level decoder circuit 102 generates a plurality of first-level decoded outputs 103, which are further decoded by a second-level decoding block 104. Each of these first-level decoded outputs 103 drives a respective second-level multi-headed decoder circuit 110. Each of these second-level multi-headed decoder circuits 110 includes a plurality of decoder "heads," each of which drives a respective one of a plurality of second-level decoded outputs 105, which are further decoded by a third-level decoding block 106. Each of these second-level decoded outputs 105 drives a respective third-level multi-headed decoder circuit 130. Each of these third-level multi-headed decoder circuits 130 includes a plurality of decoder heads, each of which drives a respective one of a plurality of third-level decoded outputs 107. The third-level decoded outputs 107 may represent individual array lines of a memory array (e.g., word lines, bit lines), or may be indirectly coupled to such array lines of the memory array.

In the first-level decoder circuit 102, each of the first-level decoded outputs is generated by decoding a portion of the row or column address appropriate for the decoder circuit 100. In the exemplary embodiment shown, each of these first-level decoded outputs may also be level shifted, at least for certain modes of operation, by a respective level shifter 108, the motivation of which is described below in the context of several exemplary embodiments.

The plurality of second-level multi-headed decoder circuits 110 are also responsive to a first plurality of bias circuits 120, 121 each respectively for generating one or more bias lines of a first type associated with a respective one of the decoder heads within the second-level multi-headed decoder circuit 110. In some embodiments, a second plurality of bias circuits (not shown) may also be utilized, each respectively for generating one or more bias lines of a second type associated with a respective one of the decoder heads within the second-level multi-headed decoder circuit 110. In some embodiments, such second type of bias lines may be shared, and implemented as one or more bias lines shared by all decoder heads within the second-level multi-headed decoder circuit 110. Each of the bias circuits 120, 121 is responsive to at least a portion of the address information, and may be further responsive to other control signals, such as mode of operation control signals. In the exemplary embodiment shown, each of these bias circuits generates level shifted output levels on its respective bias lines, at least for certain modes of operation, and which outputs, as shown, may be complementary outputs. The bias lines driven by bias circuits 120, 121 are coupled to a corresponding decoder head in each second-level multi-headed decoder circuit 110.

The plurality of third-level multi-headed decoder circuits 130 are also responsive to a first plurality of bias circuits (depicted within a first bias control circuit 134), each respectively for generating one or more bias lines of a first type associated with a respective one of the decoder heads within the third-level multi-headed decoder circuit 130. In some embodiments, a second plurality of bias circuits may also be utilized (depicted within a second bias control circuit 136), each respectively for generating one or more bias lines of a second type associated with a respective one of the decoder heads within the second-level multi-headed decoder circuit 130. In some embodiments, such second type of bias lines may be shared, and implemented as one or more bias lines shared by all decoder heads within the third-level multi-headed decoder circuit 130. As before, each of these bias circuits is responsive to at least a portion of the address information, and may be further responsive to other control signals, such as mode of operation control signals. In exemplary embodiments described herein, these bias circuits may generate level shifted output levels on one or more of its respective bias lines, at least for certain modes of operation.

Having introduced this exemplary embodiment, additional description is presented below in the context of several additional embodiments utilizing a hierarchical decoder in accordance with the present invention.

Figure 2:
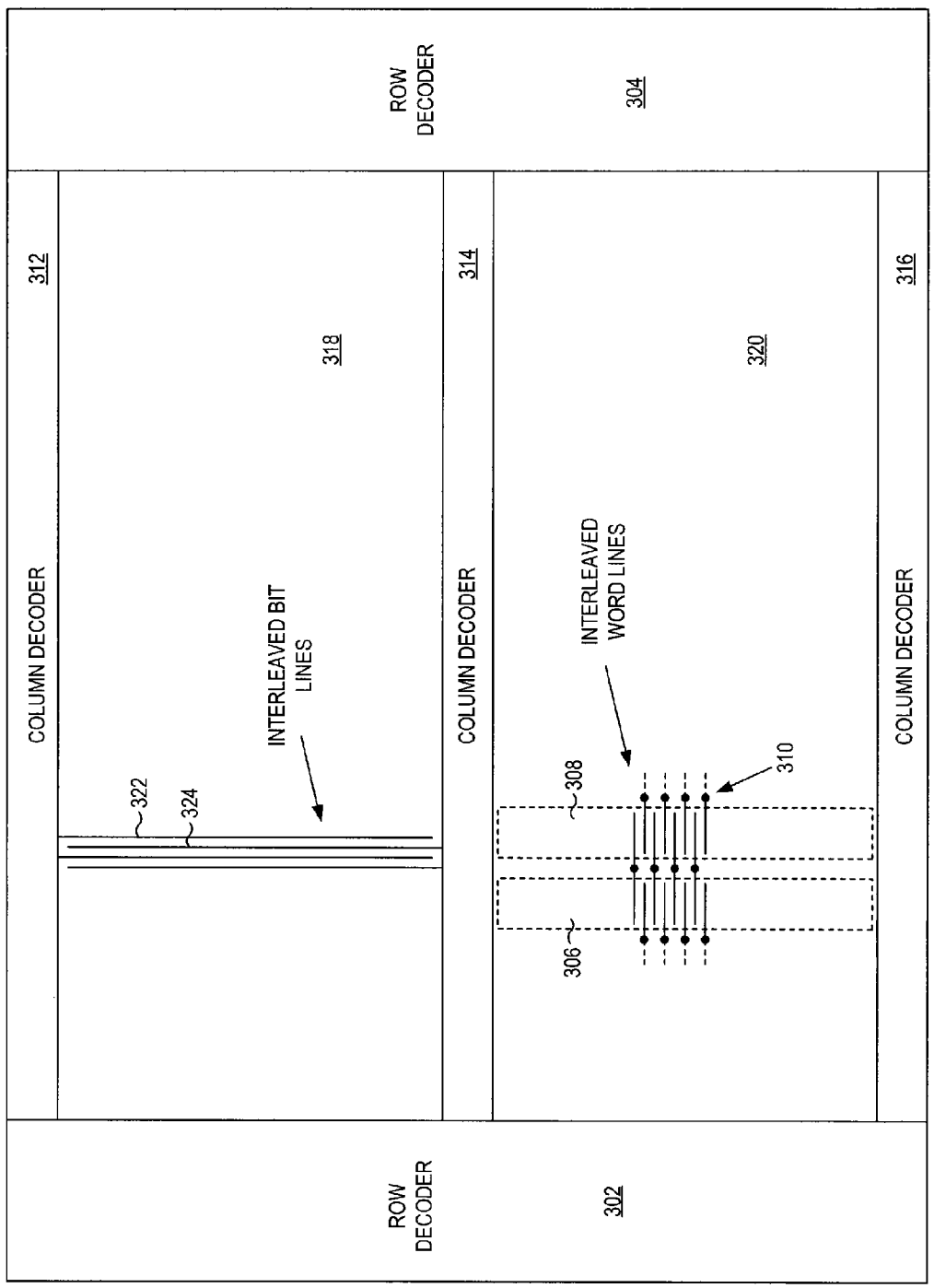
FIG. 2 is a block diagram depicting an exemplary integrated circuit including a three-dimensional memory array (shown architected in an upper memory stripe and a lower memory stripe) and which integrated circuit includes a pair of hierarchical decoders on opposite sides of the array stripes for decoding word lines, and a pair of hierarchical decoders on both top and bottom of each array stripe for decoding bit lines.

FIG. 2 is a block diagram of an exemplary memory array 300. Two row decoders 302, 304 generate row select lines for the array, which each traverse across the array 300, as will be described herein. The word line driver circuits (not shown) are spatially distributed beneath the memory array and make connection to the word lines by way of vertical connections (one of which is labeled 310) on alternating sides of individual memory array blocks (two which are labeled 306, 308). The memory array is divided into two "stripes" 318, 320 by three column decoder and bit line circuit blocks 312, 314, 316, respectively at the top, middle, and bottom of the array. The bit lines within each stripe are also 2:1 interleaved to relax the pitch requirements of the column related circuitry. As an example, bit line 322 is associated with (i.e., driven and sensed by) the upper column circuit block 312, while bit line 324 is associated with the middle column circuits block 314.

In an exemplary embodiment, the memory array 300 is a three-dimensional memory array of passive element memory cells formed on each of four memory planes. Such memory cells preferably are antifuse cells. Each logical word line is connected to a word line segment on each of four word line layers (each associated with a respective memory plane). Other useful details of such an array 300, including exemplary memory cell technology and configurations, exemplary voltage conditions for reading and writing the array memory cells, exemplary power grid routing, exemplary distributed bias line discharge circuits, and exemplary bias circuit configurations for word line driver circuits, are further described in "Word Line Arrangement Having Multi-Layer Word Line Segments for Three-Dimensional Memory Array" by Roy E. Scheuerlein, U.S. Patent Application Publication No. 2004-0190360 A1, which application is hereby incorporated by reference in its entirety.

Exemplary Configuration A (Column Decoder)

Each stripe of the memory array 300 is divided into a large number of blocks, such as block 308. In the exemplary embodiment depicted, each block includes 288 bit lines on each of four bit line layers for the respective four memory planes, thus totaling 1,152 bit lines per block. These bit lines are 2:1 interleaved, so that each of the column decoders at the top and bottom of an array block interfaces to 576 bit lines.

Figure 3:
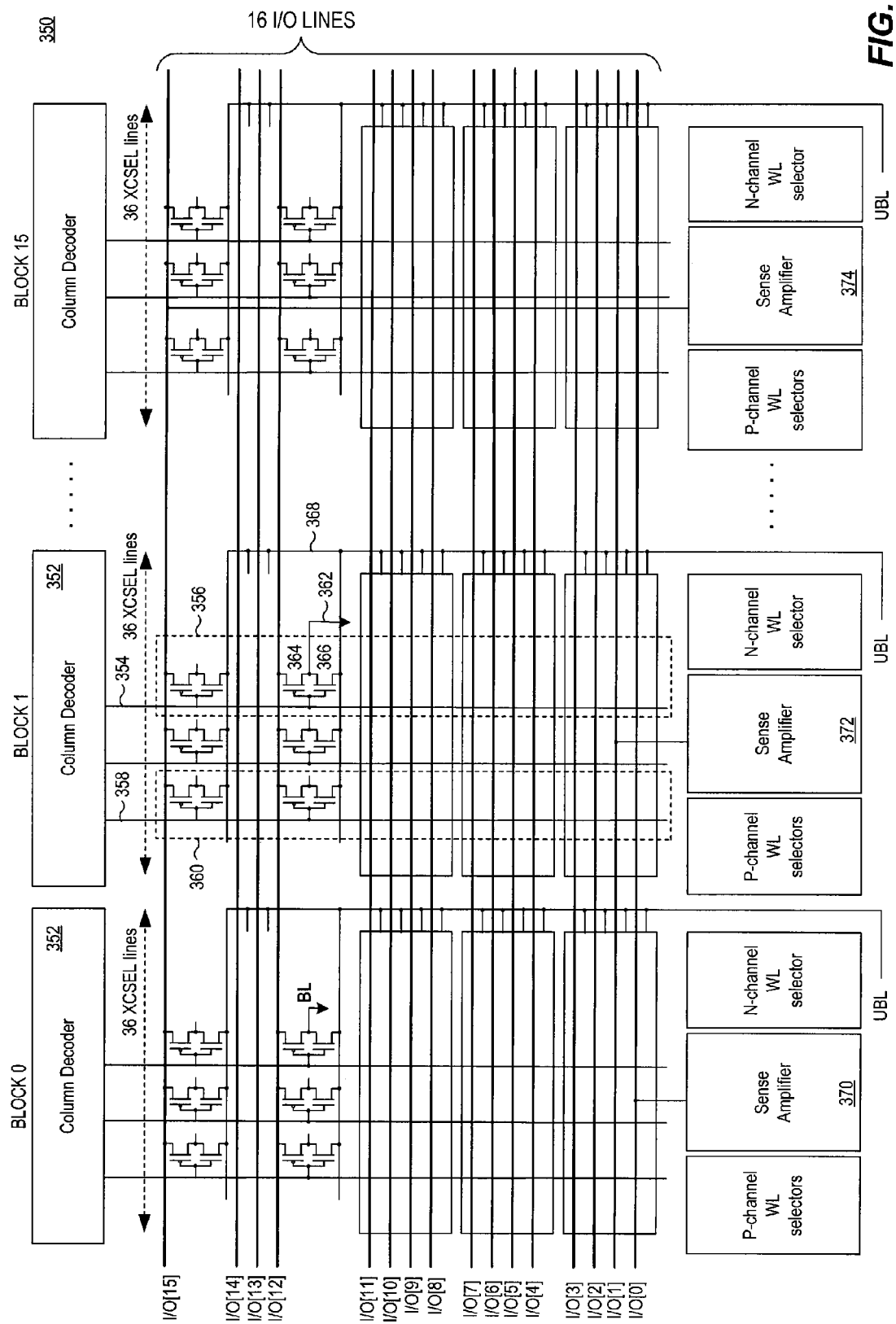
FIG. 3 is a diagram representing a portion of exemplary bit line decoding circuitry for the integrated circuit shown in FIG. 2.

Referring now to FIG. 3, a block diagram is shown depicting a portion 350 of the column decoder arrangement for 16 blocks. For clarity, the column decoder at the top of these 16 blocks is shown (e.g., within column decoder 312 for array stripe 318), but it should be understood that the column decoder at the bottom of these 16 blocks (e.g., within column decoder 314, or column decoder 316 for array stripe 320) would preferably be symmetrically identical. At the top of the memory blocks, each block contains thirty-six 16-headed column decoders which select a total of 16 bit lines which are coupled respectively to 16 horizontal bus lines, which are then coupled respectively to 16 sense amplifiers. For example, in memory BLOCK 1, thirty-six column select lines XCSEL are generated by column decoder 352, two of which are labeled 354 and 358. These XCSEL lines are active-low, and represent second-level decoded outputs of a hierarchical decoder, as described below.

The thirty-six 16-headed column decoder circuits represent a plurality of third-level multi-headed decoder circuits, two of which are labeled 356 and 360. When XCSEL signal 354 is selected (e.g., driven low), each of the sixteen decoder heads within the multi-headed decoder circuit 356 (for convenience, each of the "decoder heads 356") couples an associated bit line to a respective one of a group of sixteen bus lines I/O[0], I/O[1], . . . I/O[15]. For example, one such decoder head couples an associated bit line 362 to its associated bus line I/O[12] by way of a P-channel transistor 364. Alternatively, when the XCSEL line 354 is not selected, this head couples its associated bit line 362 to a common unselected bias line 368 associated with BLOCK 1 by way of an N-channel transistor 366.

The sixteen selected bit lines are preferably arranged as four adjacent bit lines which exit the array at the top (or the bottom for the other decoder), on each of four bit line layers. The resultant pitch of each XCSEL line is therefore the pitch of eight bit lines within the memory block (because of the 2:1 interleaving). For an exemplary 0.13 µm process technology, the XCSEL pitch is therefore 2.08 µm. The I/O[xx] bus lines may be grouped into four groups, as is depicted, which may be advantageous to facilitate independent bias conditions for bit lines on each bit line layer, particular during programming if not all of the sixteen "selected" bit lines are actually simultaneously programmed.

The sixteen I/O lines traverse horizontally across all sixteen blocks. Each is coupled to a respective one of sixteen sense amplifier circuits which are distributed among the sixteen blocks as shown. For example, a first sense amplifier 370 is disposed within BLOCK 0 and is coupled to bus line I/O[0], a second sense amplifier 372 is disposed within BLOCK 1 and is coupled to bus line I/O[1], and a sixteenth sense amplifier 374 is disposed within BLOCK 15 and is coupled to bus line I/O[15]. Each of the sixteen I/O lines may also be coupled to an associated bias circuit, which may be used during programming mode of operation to properly bias those bit lines to be programmed and those bit lines not to be programmed within the "selected" 16 bit lines. These bias circuits may be disabled and caused to exhibit a high output impedance during a read mode of operation when the selected bit lines are coupled to respective sense amplifiers.

These sixteen blocks may also be called a "bay." The memory array 300 may include one or more than one bays, and in some embodiments includes 4 bays within each array stripe. Contemplating the column decoder shown in addition to another identical column decoder for the bit lines exiting at the bottom of the array, in every group of 16 blocks (i.e., a bay) there are 32 sense amplifiers which connect to 32 selected bit lines. All the select bit lines are within one of the sixteen blocks, and no other bit lines are selected within the bay. As described below, the sense amplifiers may be conveniently implemented beneath the memory array block, whereas the bus lines I/O[xx], the sixteen-headed column select decoders (such as 360), and a small portion of the column decoders 352 are preferably implemented outside the array block.

Figure 4:
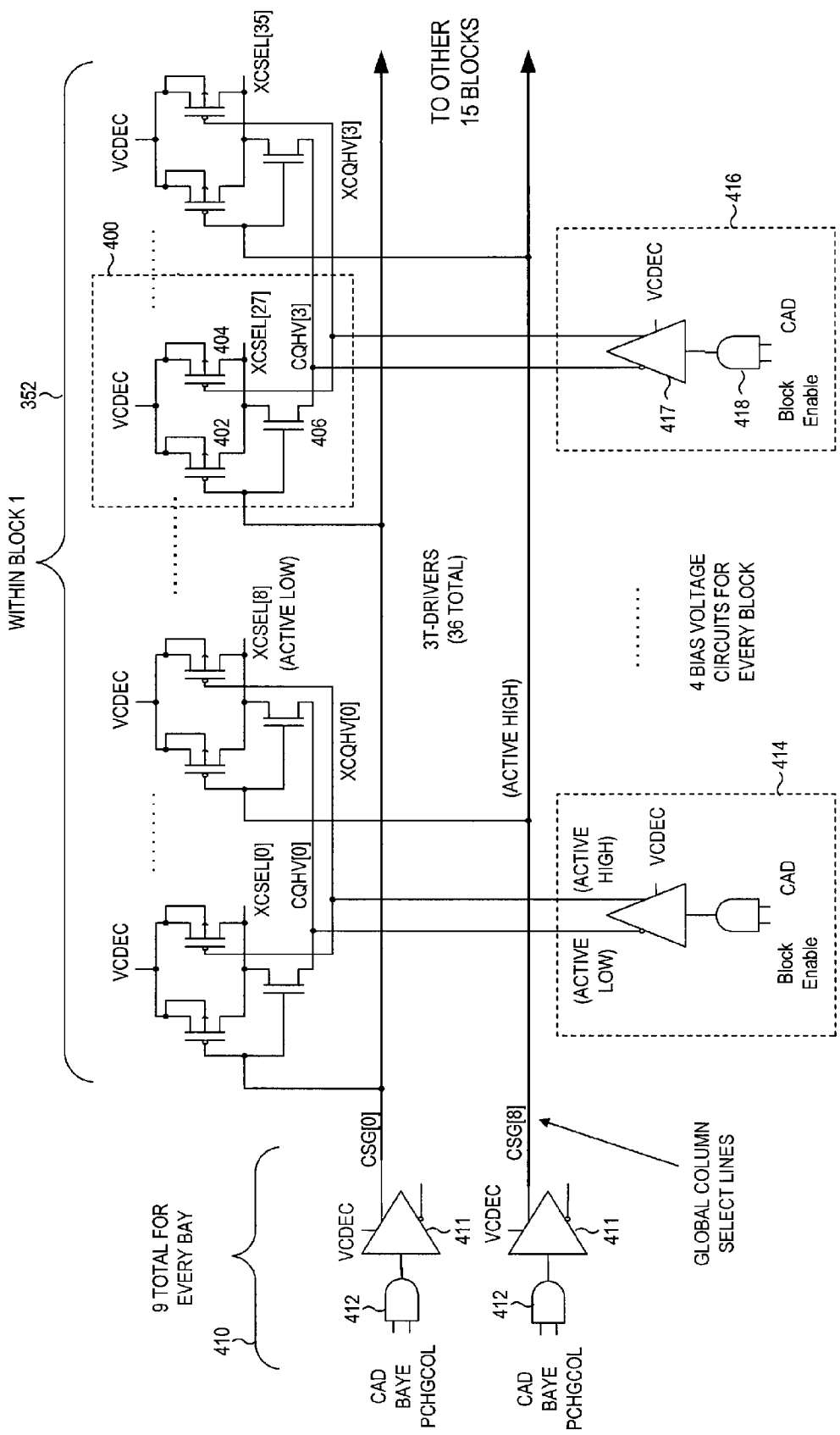
FIG. 4 is an electrical schematic diagram of a column decoder circuit useful for the decoding circuitry shown in FIG. 3.

Referring now to FIG. 4, an exemplary embodiment is shown for each of the column decoders 352. Each of the thirty-six second-level decoded outputs XCSEL is generated by a respective one of a group of thirty-six decoder heads, which may be viewed (within this block) as being arranged as nine 4-headed decoders coupled respectively to nine global column select lines CSG[0] through CSG[8]. These global column select lines CSG[xx] represent first level decoded outputs from a first level decoder 410, and are shared by all 16 blocks within the bay. In the figure, these thirty-six decoder heads are depicted as four groups of nine decoder heads, which represents a desired physical placement of such circuits, as described in the next figure below.

Four bias circuits are provided, one for each of the four heads within each multi-headed decoder circuit. Two of the bias circuits are shown, labeled 414 and 416. For example, bias circuit 416 includes a decoder portion 418 and a level shifter 417. The decoder portion 418 is responsive to appropriate column address signals CAD for selecting one of the four bias circuits within the block, and is also responsive to one or more block enable signals which may be common to all four bias circuits within the block. The level shifter 417 is used to variously shift the voltage levels of its output signals in accordance with certain operating modes, such as reading or programming.

The first-level decoder 410 generates nine global column select lines, each being generated by a decoder portion 412 followed by a level shifter 411. Each decoder portion 412 is responsive to certain column address signals CAD, a control signal BAYE associated with the particular bay within which this block is disposed, and other control signals (e.g., PCH-GCOL) to select one output thereof, which is level-shifted by the associated level shifter 411 to generate the selected global column select line, which is active high.

As may be appreciated, a particular XCSEL driver is responsive to one of the nine global column address signals CSG[xx], is responsive to one of the four bias circuits, and also responsive to yet another bias line, in this case a power supply bus line conveying a column decoder voltage VCDEC. For example, driver head 400 is responsive to CSG[0] and complementary bias nodes CQHV[3] and XCQHV[3] (and VCDEC), and generates XCSEL[27]. If CSG[0] is selected and therefore high, and CQHV[3] is selected and therefore low, then N-channel transistor 406 is conductive and drives XCSEL[27] low. P-channel transistor 404 remains off, as XCQHV[3] is high. Otherwise, one or both of P-channel transistors 402 and 404 is on, and pulls XCSEL[27] high to the VCDEC potential. For example, if the bias circuit 416 is unselected, then transistor 404 pulls XCSEL[27] high to the VCDEC potential, irrespective of the state of CSG[0]. Conversely, if CSG[0] is unselected and therefore low, then transistor 402 pulls XCSEL[27] high to the VCDEC potential, irrespective of the state of CQHV[3] and XCQHV[3]. Consequently, only one XCSEL line is selected and driven to the low level generated by one of the bias circuits, and the remaining thirty-five XCSEL lines are driven to the VCDEC level.

Each of the level shifters 411 associated with the global column select lines CSG[xx], and each of the level shifters 417 within each bias circuit 414, ... 416, serve to level shift their respective outputs to the VCDEC level which is also conveyed to each XCSEL decoder head, thus ensuring that the P-channel devices within each head may be effectively turned off when unselected.

As described below, first-level decoder 410 and the bias circuits 414, 418 may be implemented beneath the memory array block (more exactingly, within the lateral extent of the memory array block), and only the XCSEL driver heads (e.g., 3-transistor driver head 400) are disposed outside the array block, thus improving the array efficiency.

Figure 5:
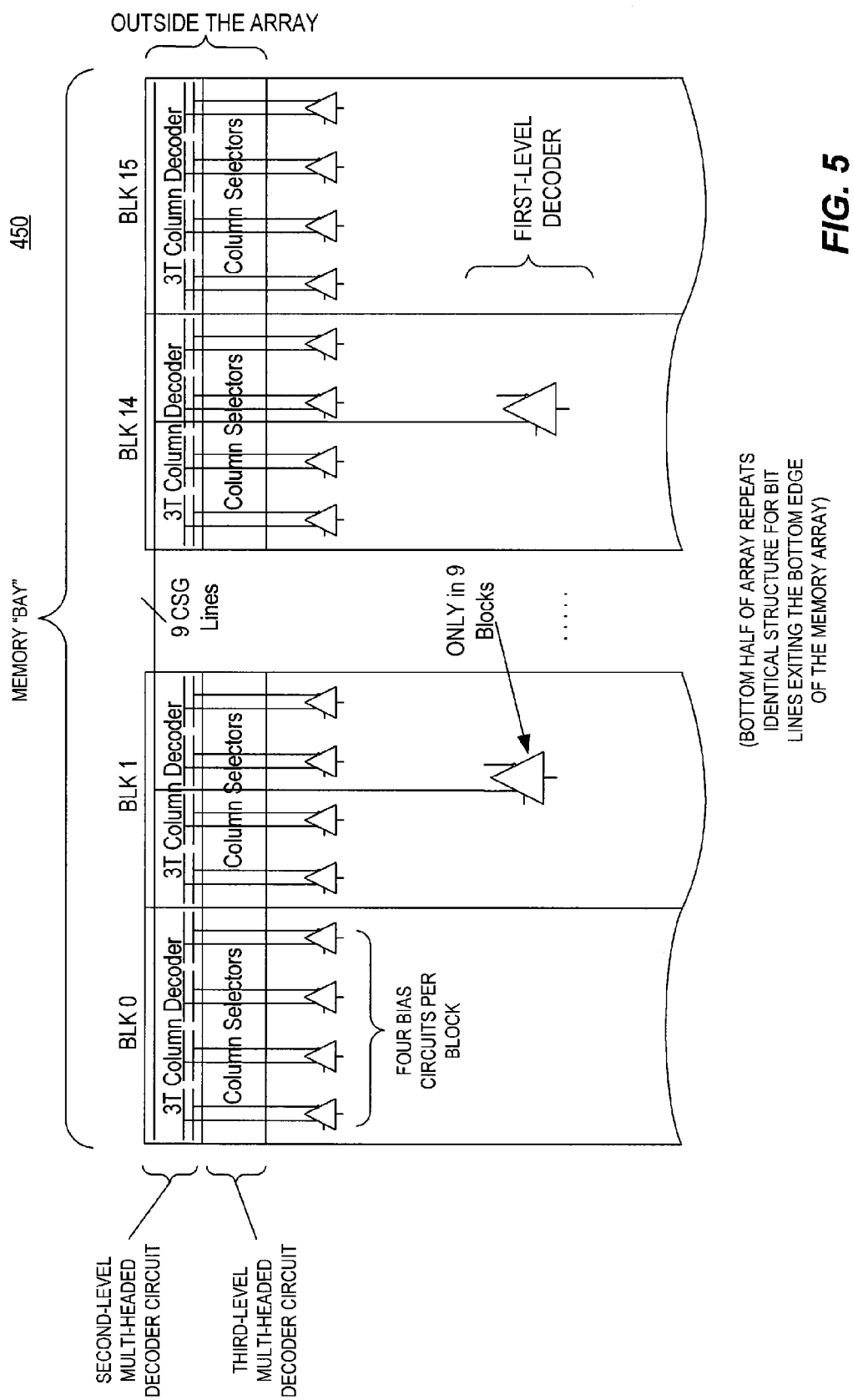
FIG. 5 is a diagram representing an exemplary physical layout arrangement of the decoding circuitry shown in FIG. 3.

Referring now to FIG. 5, an exemplary physical layout arrangement is depicted for the column decoder circuits described above for the 16 blocks within a bay. Given the description set forth above, such figure is believed to be self-explanatory, but a few salient points may be warranted. Four bias circuits are shown within each block. The complementary outputs each bias circuit traverse horizontally across, and serve decoder heads within, a respective one-fourth of the block. In contrast, the nine global column select lines CSG traverse across all 16 blocks, and serve decoder heads in all 16 blocks. The 16-headed column selectors (i.e., decoder heads 356 in FIG. 3) and the three-transistor XCSEL decoder heads 400 are shown implemented outside the array, while the bias circuits and the global column select line decoders are shown implemented beneath the array.

Exemplary Configuration B (Row Decoder)

Referring back to the exemplary array 300 shown in FIG. 2, each block (such as block 308) includes 4,096 addressable word lines, each including a word line segment on each of four word line layers, vertically connected together and to a word line driver disposed beneath the array blocks. In preferred embodiments, additional word lines are included to support testing and redundancy, which adds, for example, 88 additional word lines per block, for a total of 4,184 word lines. These word lines are 2:1 interleaved, so that the word line decoding circuitry must interface to 2,092 word line connections (e.g., vertical connection 310) between each memory block.

Every memory array block is associated with a respective plurality of 4-headed decoders on each side of the block. An individual 4-headed decoder on the left side of the block and a corresponding 4-headed decoder on the right side of the block are both responsive to a single decoded line from a common row select decoder, and together decode 1 out of 8 word lines within the block.

Figure 6:
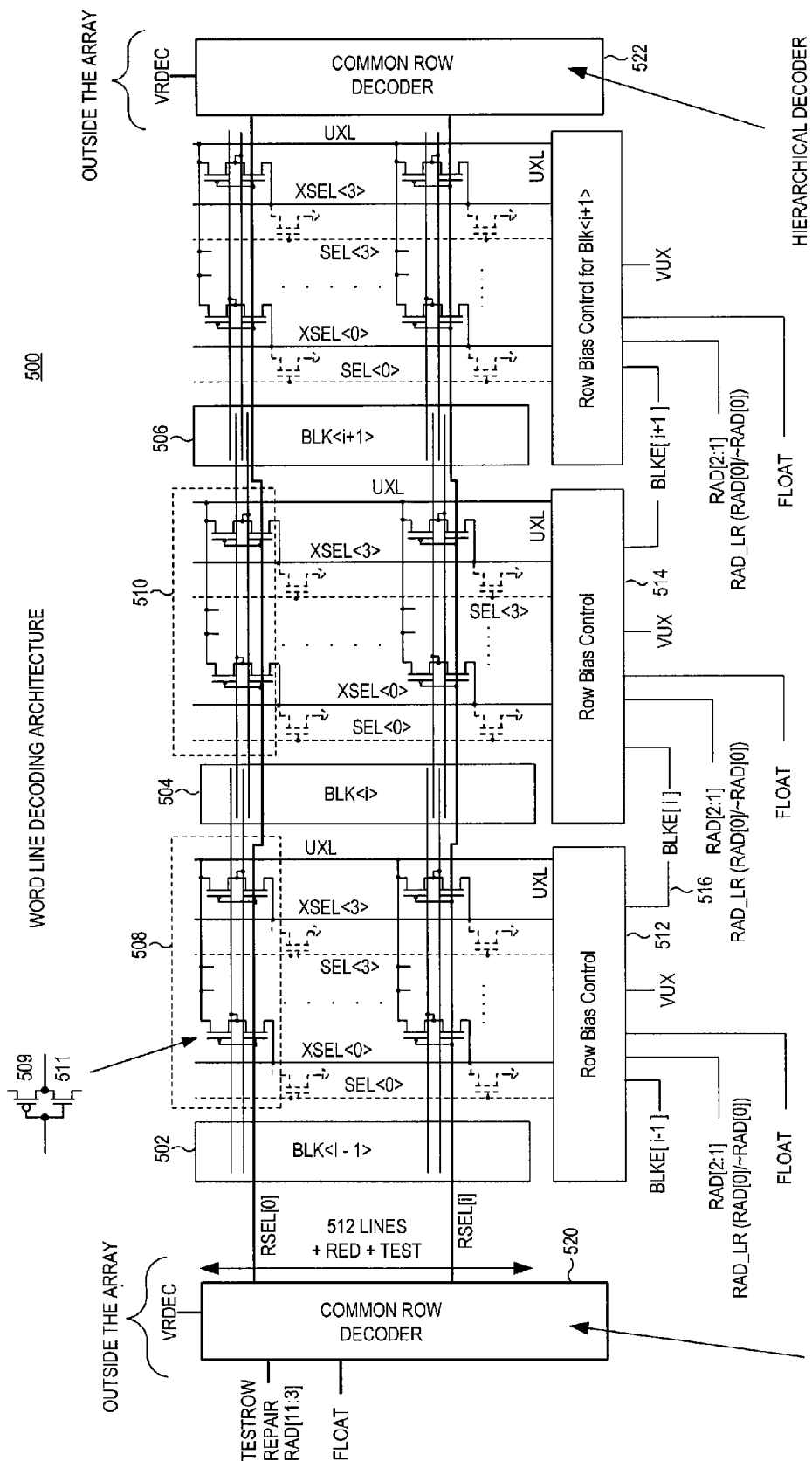
FIG. 6 is a combined schematic/block diagram representing a portion of exemplary word line decoding circuitry for the integrated circuit shown in FIG. 2.

Referring now to FIG. 6, a block diagram is shown which represents an exemplary embodiment of a hierarchical, multi-level, multi-headed word line decoder circuit arrangement 500, which is intended to convey both certain circuit details and certain layout relationships of the various constituent blocks shown. Three memory blocks 502, 504, 506 each include 4184 word lines. A four-headed word line driver 508 is shown to the left of block 504, and drives four word lines exiting memory block 504 to the left, while another four-headed word line driver 510 is shown to the right of block 504, and drives four word lines exiting memory block 504 to the right. The word lines are 2:1 interleaved so that adjacent ones exit the block on opposite sides thereof. Both four-headed word line drivers 508 and 510 are responsive to a single row select line RSEL[0] to decode and select 1 of 8 word lines in block 504.

As shown, the four word lines associated with the four-headed word line driver 508 are common to two adjacent memory blocks 502, 504. In other words, a given four-headed word line driver decodes and drives four word lines in each of two adjacent blocks. As implied by the figure, these adjacent blocks may be viewed as being respectively to the left and to the right of the associated word line drivers. However, in preferred embodiments such four-headed word line drivers are disposed substantially beneath the array blocks, and only the vertical connections to the word lines made between the blocks.

Each four-headed word line driver is responsive to an associated group of four "selected" bias lines and one unselected bias lines, all generated from an associated bias circuit. For example, the four-headed word line driver 510, as well as the additional word line driver circuits associated with word lines in both blocks 504 and 506, all share a group of four selected bias lines XSEL<0>, XSEL<1>, . . . XSEL<3>, and a common unselected bias line UXL generated by row bias circuit 514. Likewise, the four-headed word line driver 508, as well as the additional word line driver circuits associated with word lines in both blocks 502 and 504, all share a respective group of four selected bias lines XSEL<0>, XSEL<1>, . . . XSEL<3>, and a respective unselected bias line UXL generated by row bias circuit 512. Both row bias circuits 512, 514 are enabled by a BLKE[i] signal 516 when block 504 (also labeled BLK<i>) is selected. Each row bias circuit is also responsive to a two-bit portion of a row address RAD[2:1] to select which of the four heads is selected, responsive to a FLOAT signal for floating the selected and/or unselected bias lines during certain operation modes, and a VUX input conveying the voltage to which the UXL line, during certain modes of operation, is driven.

A complementary group of four selected bias lines SEL<0>, SEL<1>, . . . SEL<3> are also shown, the selected one of which is driven high. Such lines, if implemented, may be used to accomplish a distributed grounding path through the selected memory block to better provide a robust local ground potential for the selected word line drivers. Such a distributed grounding circuit is described further in "Word Line Arrangement Having Multi-Layer Word Line Segments for Three-Dimensional Memory Array" by Roy L. Scheuerlein, U. S. Application No. 10/403,844 filed Mar. 31, 2003, now published as U.S. Pat. Application Publication No. 2004-0190360 A1, which application is hereby incorporated by reference in its entirety.

As shown, each word line driver includes a P-channel transistor (e.g., transistor 509) which couples its associated word line to the shared unselected bias line UXL associated therewith when the RSEL line is unselected (i.e., low), and further includes an N-channel transistor (e.g., transistor 511) which couples its associated word line to the associated one of the group of selected bias lines XSEL<0>, XSEL<1>, . . . XSEL<3> associated therewith when the RSEL line is selected (i.e., high). One of these selected bias lines is decoded and driven to a low level by the row bias circuit (assuming the associated memory block is selected), and the other three selected bias lines are driven with a voltage suitable for an unselected word line. Consequently, a single selected RSEL line drives one word line low in the selected memory block, and drives the other seven word lines in the selected block to an unselected bias level, albeit by way of a "selected" bias node for the multi-headed drivers. In other non-selected memory blocks, all four selected bias nodes are driven to an unselected bias level so that no word lines are selected by the active RSEL line.

The row select line RSEL[0] traverses across all the memory blocks in the entire memory stripe, and drives a respective four-headed word line driver located "between" each pair of blocks of the stripe (as well as two more, each respectively located "outside" the first and last blocks). A total of 512 such RSEL lines are likewise routed across the array and similarly coupled to respective plurality of four-headed word line drivers. Eleven additional RSEL lines are provided for the 88 test and redundant word lines, for a total of 523 RSEL lines (also known as "global row lines" and "global word lines"). Additional details of exemplary circuits, operation, bias conditions, float conditions, modes of operation including read and program modes, and the like, are further described in "Word Line Arrangement Having Multi-Layer Word Line Segments for Three-Dimensional Memory Array" by Roy E. Scheuerlein, U.S. Patent Application Publication No. 2004-0190360 A1, already referenced above.

To speed up the selection time of a global row line, these RSEL lines are driven at both ends thereof by two hierarchical row select decoders 520, 522 (also known as "global row decoders 520, 522"), each respectively located outside the array at left and right sides of the array stripe. By using a hierarchical decoder structure the size of the global row decoder 520 is reduced, thus improving the array efficiency. In addition, a reverse decoding mode may be conveniently provided for improved testing capability, as further described in the aforementioned "Dual-Mode Decoder Circuit, Integrated Circuit Memory Array Incorporating Same, and Related Methods of Operation" by Kenneth K. So, Luca G. Fasoli, and Roy E. Scheuerlein.

Figure 7:
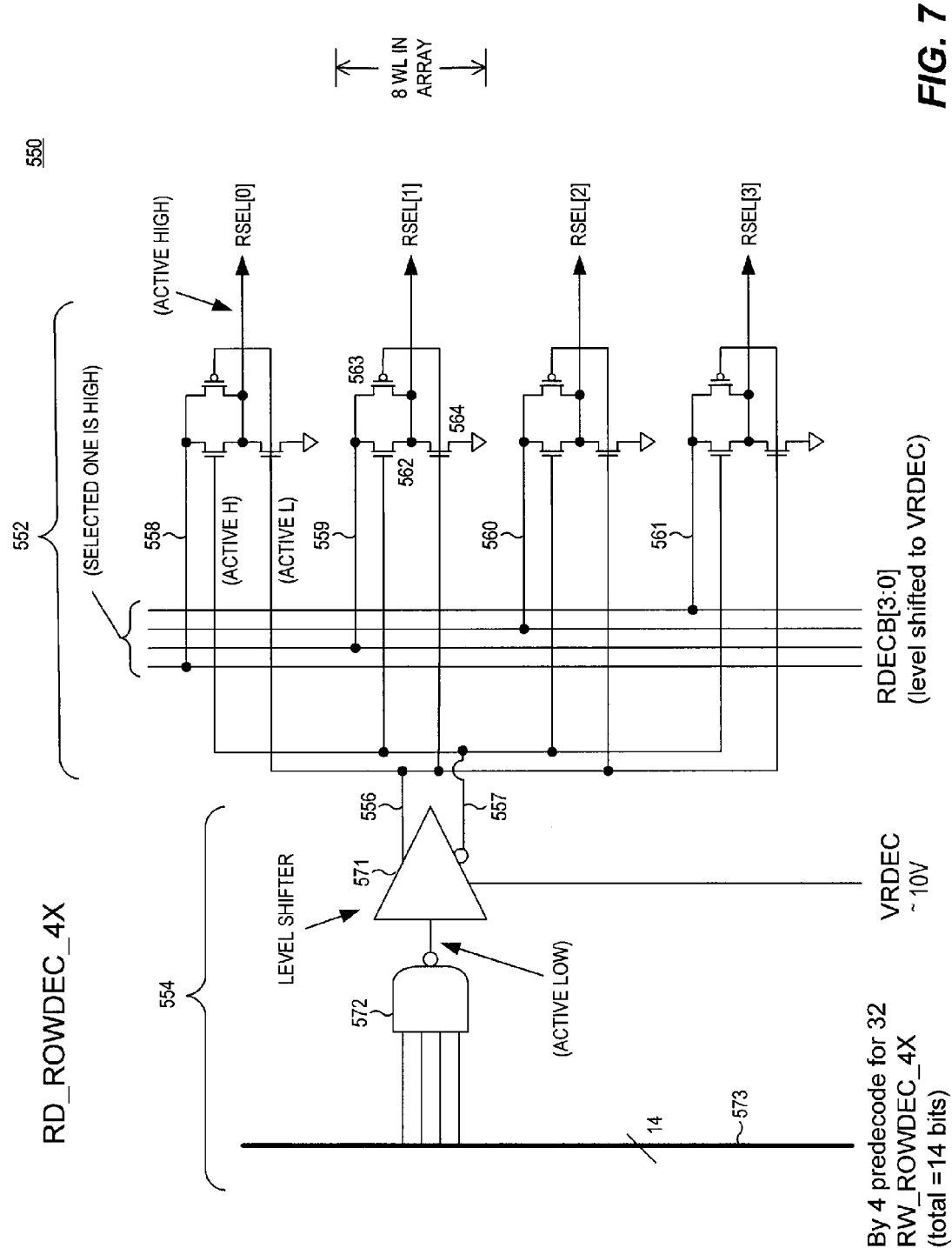
FIG. 7 is a diagram representing an exemplary multi-headed decoder circuit useful for the word line decoding circuitry shown in FIG. 6.

Referring now to FIG. 7, an exemplary embodiment of a portion of the global row decoders 520, 522 is depicted, which includes a four-headed decoder 552 for driving four global row lines, shown here labeled as RSEL[0], RSEL[1], RSEL[2], and RSEL[3]. This four-headed decoder 552 may be viewed as a second-level multi-headed decoder circuit and is responsive to a first-level decoded output 556 (and its complementary output 557) from a first-level decoder 554. (Actually, the first-level decoder 554 properly includes other portions not shown here, such as circuitry for generating a group of pre-decoded lines 573, described below.) A NAND gate 572 receives a unique combination of four of the fourteen pre-decoded lines 573 to decode an active-low output which is then level-shifted by level shifter 571 to generate the complementary first-level decoded outputs 556, 557. The NAND gate 572 and level-shifter 571 are repeated (obviously with different unique combinations of the pre-decoded lines) to generate a respective first-level output for every four global row lines RSEL. The four-headed decoder 552, as well as the first-level decoder "slice" which includes a single NAND gate 572 and level-shifter 571 may be viewed as together forming a row decoder cell RD_ROWDEC_4X, which is used repeatedly to implement the full global row line decoder, as described below.

The four-headed decoder 552 is associated with four "selected" bias lines RDECB[3:0]. The rationale for such a name is because a given decoder head couples its output to a "selected" bias line if the input to the decoder head is selected (i.e., driven to an active level). However, by no means does this imply that all four of the heads shown drive their respective outputs to a level that is reflective of the output being selected, because typically only one of the selected bias lines is actually biased in a condition suitable for a selected output, and the remaining three selected bias lines are biased in a condition suitable for an unselected output. The decoder heads shown include three transistors, including N-channel transistor 562 and P-channel transistor 563 which together form a circuit for coupling the decoder head output node to an associated one of a first group of bias lines, in this case the group of four bias lines RDECB[3:0]. In the one four-headed decoder 552 that is selected at any one time (i.e., whose input nodes 556 and 557 are respectively low and high) both of these transistors are on in each of the four decoder heads, and each head drives its output to whatever bias level is conveyed on the associated selected bias line to which the head is coupled, since the transistors 562, 563 form a full transfer gate.

Conversely, if the input node for the multi-headed decoder is inactive or unselected, then all such heads drive their respective outputs to an associated "unselected" bias line. For many useful embodiments, such unselected bias lines may be combined into a single bias line shared by all heads of the multi-headed decoder. Such is the case here, with the additional twist that the unselected bias line is actually tied to ground since this potential is appropriate unselected global row lines for all operating modes. In a more general view, however, the decoder heads shown include an N-channel transistor 564 which may be viewed as forming a circuit for coupling the decoder head output node to an associated one of a second group of bias lines, in this case a group of only one shared bias line, which is a ground line. In the four-headed decoders 552 that are unselected (i.e., whose input nodes 556 and 557 are respectively high and low) the respective transistor 564 in each of the four decoder heads is turned on, and each head drives its output to whatever bias level is conveyed on the associated unselected bias line to which the head is coupled, here a ground potential.

Figure 8:
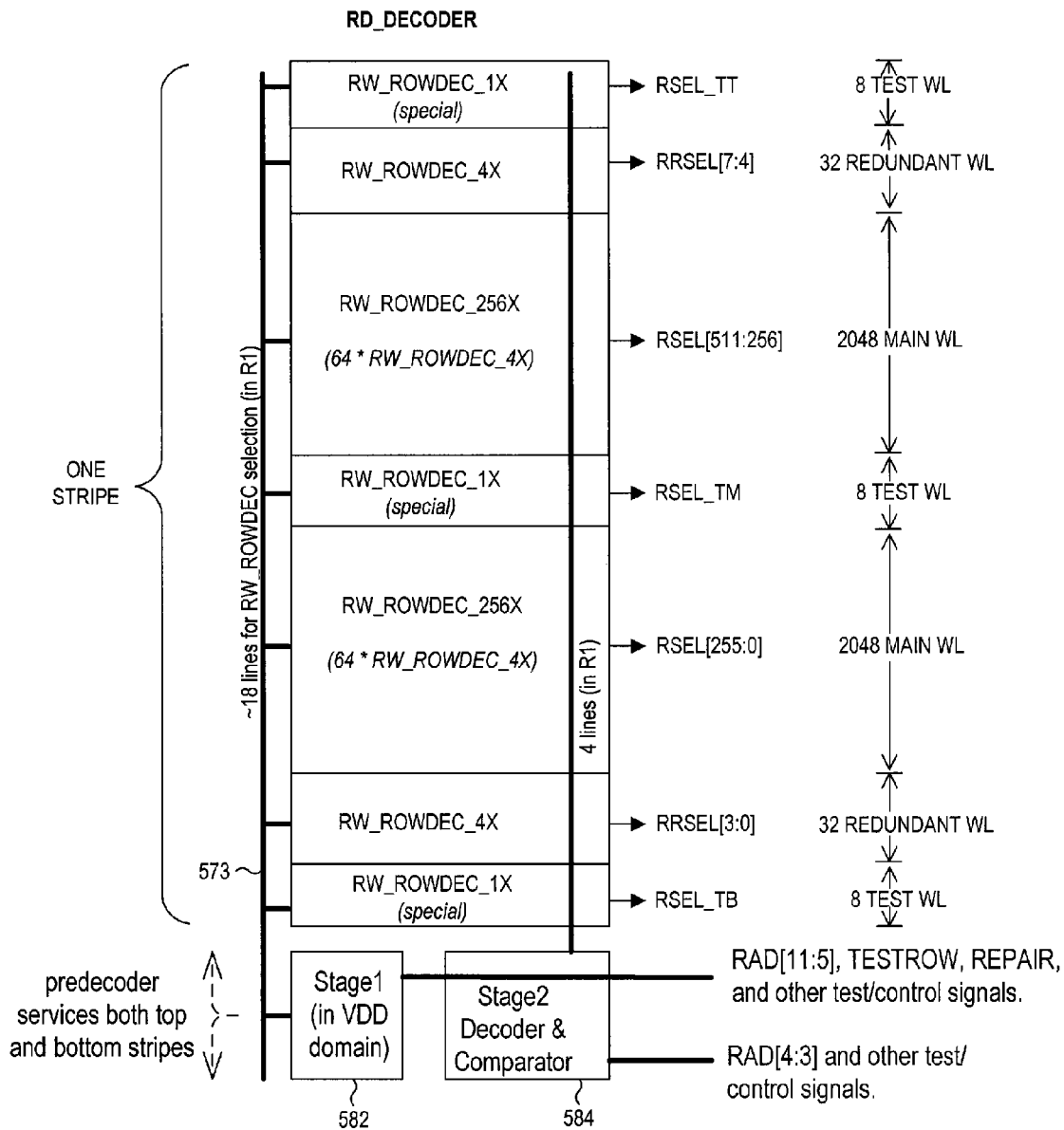
FIG. 8 is a diagram representing an exemplary physical layout arrangement of the multi-headed decoder circuit shown in FIG. 7 within the word line decoding circuitry shown in FIG. 6.

Referring now to FIG. 8, a higher-level view of global row decoder 520 is shown. This view also corresponds to the upper half of row decoder 302 shown in FIG. 2. Multiple instantiations of the RD_ROWDEC_4X cell are implemented to generate all the necessary global row lines. A pre-decoder 582 (also labeled as a "Stage 1 Decoder") is shown which generates the pre-decoded lines 573 described above. Also shown in a Stage 2 Decoder and Comparator 584, which generates the four selected bias lines 558, 559, 560, 561 for the four-headed decoder 552 during normal read and programming operations. However, during certain test modes, such selected bias lines function as match lines in a reverse decoding mode for comparing the selected global row line driven by the other of the two global row decoders. Details of such operation, and other details of the Stage 2 Decoder and Comparator 584 are described in the aforementioned "Dual-Mode Decoder Circuit, Integrated Circuit Memory Array Incorporating Same, and Related Methods of Operation" by Kenneth K. So, Luca G. Fasoli, and Roy E. Scheuerlein.

Exemplary bias conditions during programming for the cross-point array 300 are as follows: selected bit lines are driven to approximately 10 volts; unselected word lines are driven to approximately 9 volts; unselected bit lines are driven to approximately 1 volt, and selected word lines are driven to ground or near ground. This corresponds to a programming voltage of 10 volts. During a read mode of operation, the read voltage is approximately 2 volts. Additional description of suitable bias conditions and circuits for similar memory arrays may be found in "Multi-Headed Decoder Structure Utilizing Memory Array Line Driver with Dual Purpose Driver Device" by Roy E. Scheuerlein and Matthew P. Crowley, U.S. Patent Application Publication No. US 2003-0128581 A1, which application is hereby incorporated by reference in its entirety; in "Method and Apparatus for Biasing Selected and Unselected Array Lines When Writing a Memory Array" by Roy E. Scheuerlein, U.S. Pat. No. 6,618, 295, which is hereby incorporated by reference in its entirety; and in "Three-Dimensional Memory Array Incorporating Serial Chain Diode Stack" by Kleveland, et al, U.S. Pat. No. 6,631,085, which is hereby incorporated by reference in its entirety.

Exemplary Configuration C (Row Decoder)

Figure 9:
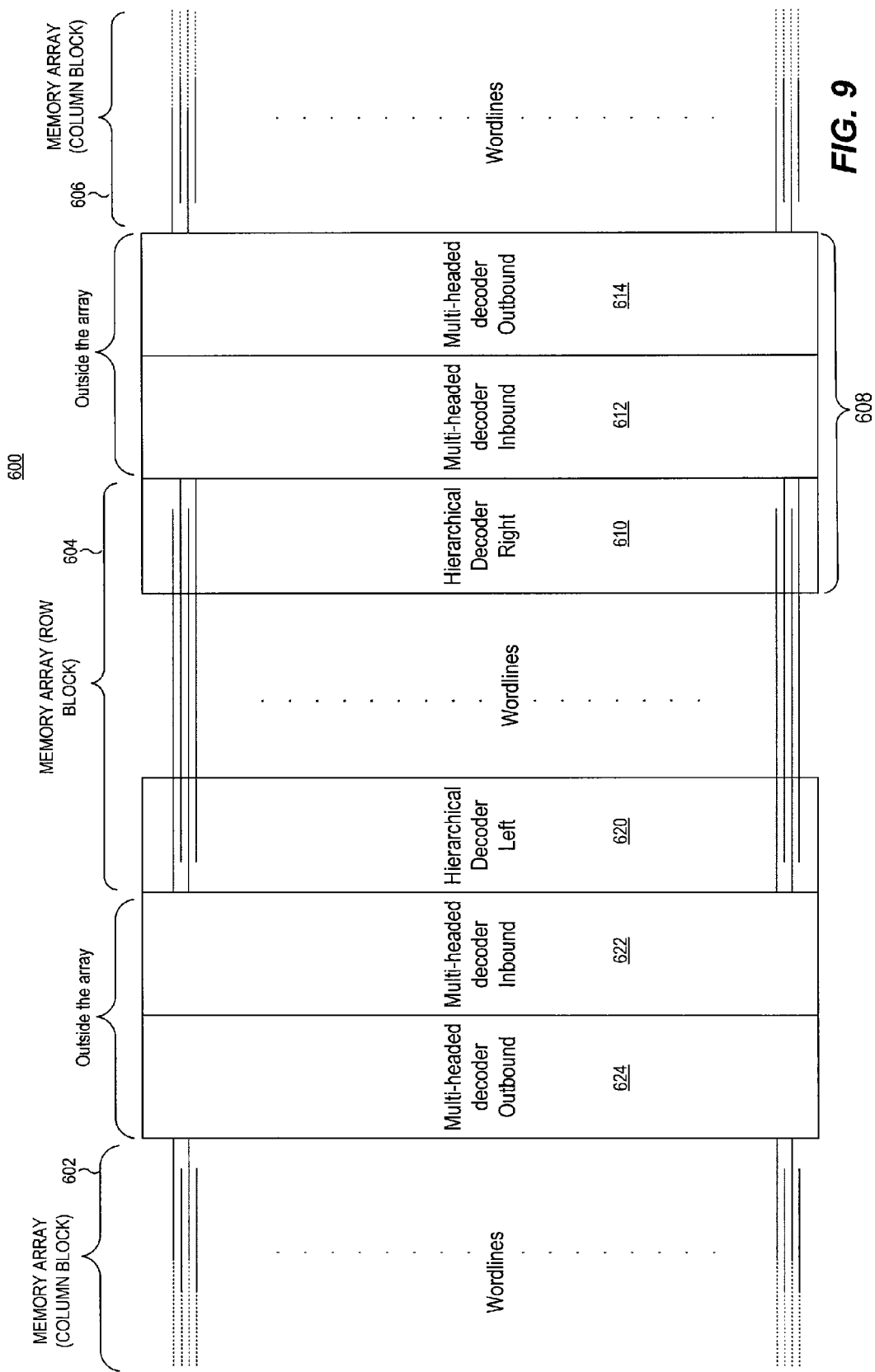
FIG. 9 is a block diagram depicting an exemplary physical layout arrangement of a hierarchical multi-headed word line decoder circuit for a three-dimensional NAND string memory array, in accordance with some embodiments of the present invention.

Another exemplary embodiment of a hierarchical multi-level multi-headed decoder circuit is introduced in the context of a word line decoder for a three-dimensional read/write memory array incorporating NAND strings. Referring now to FIG. 9, a block diagram depicts three memory array block 602, 604, 606. One word line decoder 608 includes a hierarchical decoder 610 whose decoded outputs drive a multi-headed inbound word line decoder 612 and a multi-headed outbound word line decoder 614. The hierarchical decoder 610 is conveniently implemented beneath the memory array block 604 (which is thus thought of as a row block), while the inbound word line decoder 612 and outbound word line decoder 614 are implemented outside the array block (i.e., between array blocks 604 and 606). Similarly, another word line decoder includes a hierarchical decoder 620, a multi-headed inbound word line decoder 622, and a multi-headed outbound word line decoder 624. Word lines within the array block 604 are 2:1 interleaved, half being driven by the multi-headed inbound word line decoder 612, and the remaining half being driven by the multi-headed inbound word line decoder 622.

The multi-headed outbound word line decoder 614 drives half of the word lines within array block 606 (the other half being driven by another outbound word line decoder not shown). No word line related circuitry is implemented beneath the array block 606, which area may instead be used for column support circuitry, and block 606 is thus thought of as a column block. This allows the row and column decoder circuits to be arranged in a checkerboard fashion, as is described in greater detail in U.S. Pat. No. 6,567,287 to Roy E. Scheuerlein, entitled "Memory Device with Row and Column Decoder Circuits Arranged in a Checkerboard Pattern under a Plurality of Memory Arrays," the disclosure of which is hereby incorporated by reference.

Figure 10:
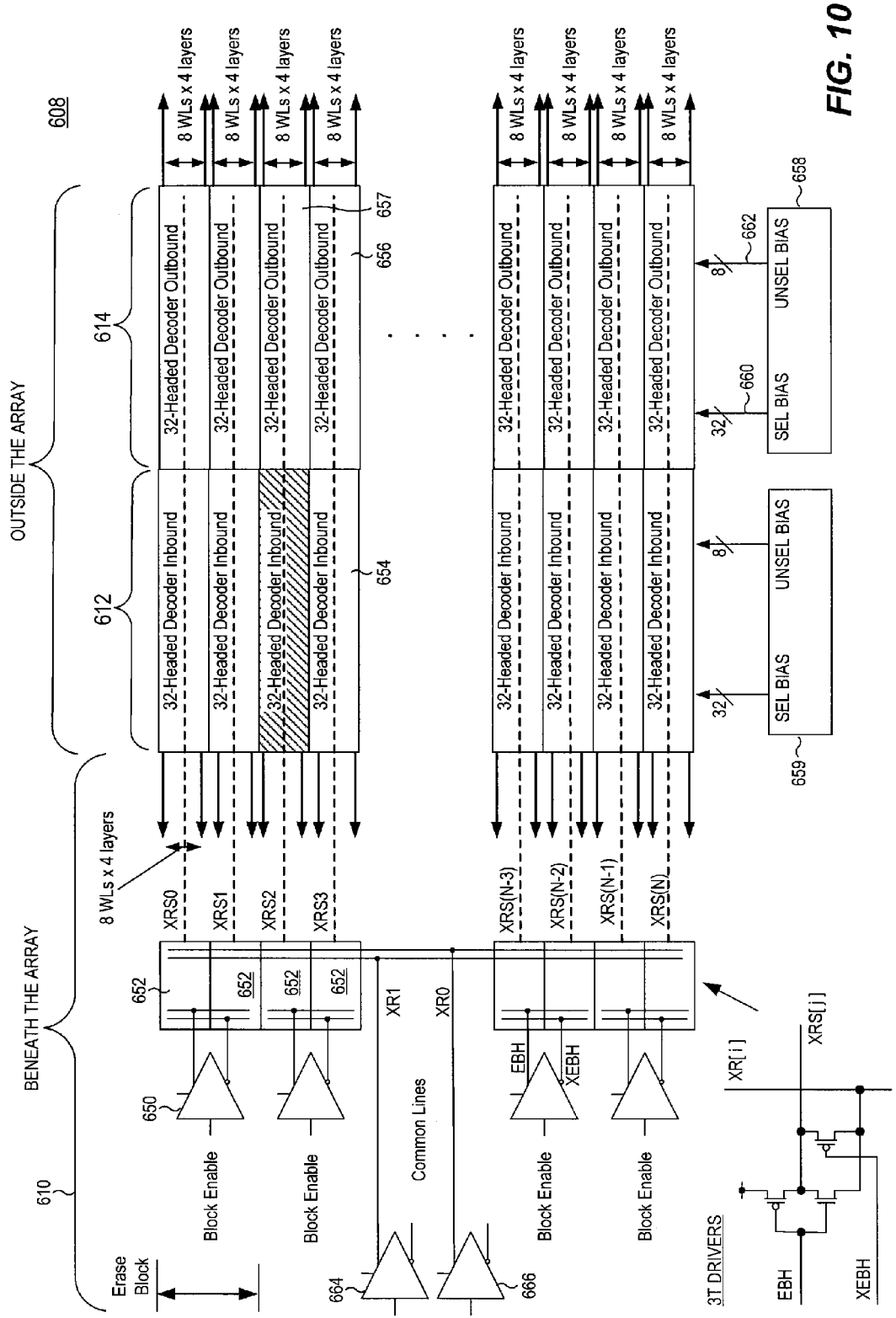
FIG. 10 is a block diagram depicting an exemplary structure and physical layout arrangement of the word line decoder circuit shown in FIG. 9, including related decoder circuits and bias circuits.

Referring now to FIG. 10, a more detailed representation of the word line decoder 608 is shown. The hierarchical decoder 610 generates a plurality of second-level decoded outputs XRS0, XRS1, ... XRS(N), each of which drives a respective third-level 32-headed decoder circuit 654 for driving 32 word lines in an inbound direction, and further drives another respective third-level 32-headed decoder circuit 656 for driving 32 word lines in an outbound direction. In each of the inbound and outbound directions, the thirty-two word lines are preferably disposed as eight word lines on each of four word line layers of the memory array. The plurality of 32-headed decoder circuits 656 collectively forming the multi-headed outbound word line decoder 614 are associated with a bias generator circuit 658, which preferably generates thirty-two "selected" bias lines 660, and eight "unselected"

bias lines 662. This allows the selected and unselected bias conditions for word lines on each word line layer to be easily controlled independently. Another similar bias generator circuit 659 is also associated with the plurality of 32-headed decoder circuits 654 collectively forming the multi-headed inbound word line decoder 612. As described below, adjacent pairs of the 32-headed decoder circuits (e.g., 656, 657) preferably are arranged so that the eight word lines (on each of four layers) associated with one such decoder (e.g., 656) overlay the eight word lines (on each of four layers) associated with the other such decoder (e.g., 657).

Each of the second-level decoded output XRS[xx] lines is generated by a three-transistor decoder head 652 which is responsive to a complementary pair of level-shifted Block Enable signals received from a level-shifter 650, and further responsive to one of two "selected" bias lines XR0 and XR1. The "unselected" bias line for the decoder heads 652 is a shared bias line, in this case a decoder power supply line (which may convey different voltages depending upon the operating mode). The various Block Enable signals would be generated based upon decoding various row addresses, which may be viewed therefore as a first-level decoder circuit having a plurality of first-level decoded outputs (i.e., the complementary level-shifted block enable signals). Each of these decoded outputs then drives a second-level 2-headed decoder circuit, each head 652 of which drives a respective one of a plurality of second-level decoded outputs (i.e., XRS[xx]). Lastly, each of these second-level decoded outputs then drives a third-level 64-headed decoder circuit (i.e., the 32-headed decoder circuit 654 and the 32-headed decoder circuit 656), each head of which drives a respective third level decoded output (i.e., an individual word line of the array). Preferably the decoder heads with the 32-headed decoder circuit 654, 656 are two-transistor word line drivers including a P-channel transistor coupling the respective word line to its associated selected bias line, and an N-channel transistor coupling the respective word line to its associated unselected bias line, both gated by the XRS[xx] signal.

In the exemplary embodiment shown, each NAND string includes a first select device coupling the NAND string to a global bit line, sixteen memory cell devices, and a second select device coupling the NAND string to a common source node or bias node. Thus, each NAND string requires 16 word lines and 2 select lines. In an erase mode of operation, all memory cells in each NAND string of a group of NAND strings sharing word lines are erased simultaneously. This group of memory cells defines an erase block. The Block Enable signals shown above correspond to an erase block (i.e., control 16 word lines (i.e., 8 word lines from this decoder, and 8 interleaved word line from the decoder on the opposite side of the memory block).

When reading, programming or erasing, the word lines belonging to the selected block are driven to either a selected voltage (e.g., $V_{PROGRAM}$) or an unselected voltage (e.g., $V_{PASS}$), which voltages are different from the selected voltage and an unselected voltage for all the other unselected strings (e.g., both of which may be preferably driven to ground). In a selected NAND string having 16 memory cell transistors and utilizing interleaved word lines (thus receiving 8 word lines from each side of the memory block), a selected XRS line preferably controls all eight word lines driven on one side of the block so that one memory cell transistor is driven to an appropriate selected condition (for reading or writing), while the other seven unselected memory cells are driven to an appropriate passing condition. (On the other side of the memory block, all eight word lines would be driven to a passing condition.) An 8-headed decoder would suffice logically, but is difficult to interface with 8 word lines on a single word line layer, particularly in a three-dimensional array with other word lines on other layers. In other nonselected memory blocks, all such word lines are preferably driven to the same level, such as ground.

Figure 11:
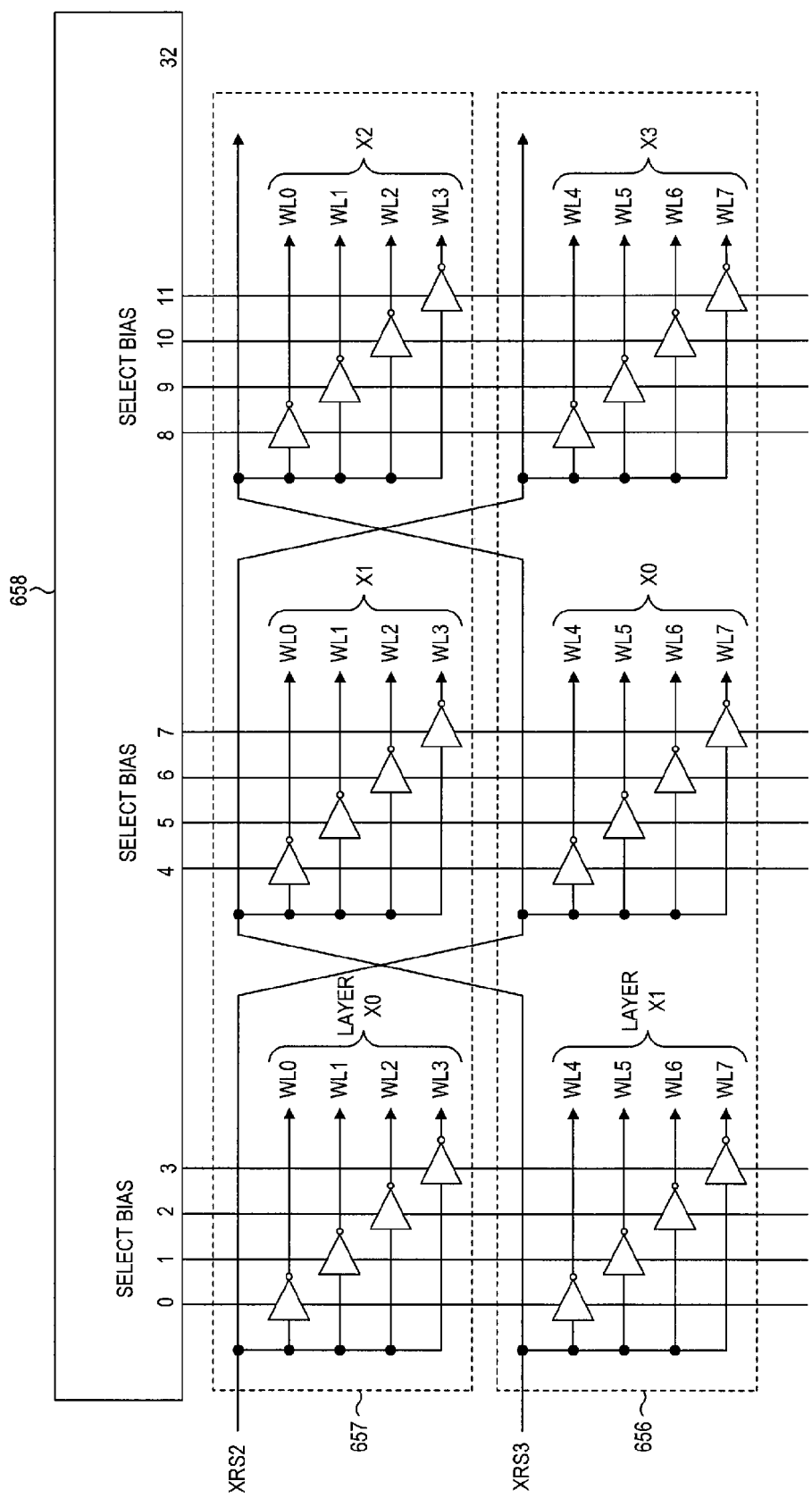
FIG. 11 is a block diagram depicting an exemplary structure and physical layout arrangement of a portion of the circuit shown in FIG. 10, and particularly highlights a useful configuration for two adjacent 32-headed decoder circuits.

Referring now to FIG. 11, a useful circuit and layout arrangement is shown for adjacent pairs of 32-headed decoders, such as decoder 656 and 657. Within decoder 656, twelve of the thirty-two decoder heads are shown, each responsive to the XRS2 signal. If the XRS2 signal is selected (i.e., active low as shown here), then eight decoder heads are enabled to couple word lines WL0, WL1, ... WL7 on word line layer X0 to a respective selected bias signal generated by bias circuit 658. With eight heads all selected by the XRS2 decoded node, the bias circuit 658 can control all eight word lines on layer X0. As shown, however, four of these eight decoder heads (driving word lines WL0-WL3) are disposed within the decoder 657, whereas the other four decoder heads (driving word lines WL4-WL7) are disposed within decoder 656. Similarly, if the XRS3 signal is selected, then eight decoder heads are enabled to couple word lines WL0, WL1, ... WL7 on word line layer X1 to the respective selected bias signals (labeled here as SELECT BIAS 0, 1, 2, ... 7) generated by bias circuit 658. Four of these eight decoder heads (driving word lines WL0-WL3) are disposed within the decoder 657, whereas the other four decoder heads (driving word lines WL4-WL7) are disposed within decoder 656. As depicted, the pair of XRS lines alternate their connections to the decoder heads after each group of four decoder heads. By implementing a hierarchical word line decoder which has one decoding path based on the block enable, and the other decoding path based on layer and word line select information (i.e., since different layers have different unselected voltages), the decoder structure lends itself to a very effective and straightforward implementation. Other structures, such as a local unselected bias switch per erase block, that selects between a ground level (for unselected strings) and a $V_{PASS}$ level (for the selected string), may also be employed to help provide suitable biasing conditions for all word lines in both selected and unselected memory blocks.

Additional details of exemplary three-dimensional NAND string memory arrays, methods of operation, and fabrication of same, are described in: "Programmable Memory Array Structure Incorporating Series-Connected Transistor Strings and Methods for Fabrication and Operation of Same" by Roy E. Scheuerlein, et al., U.S. application Ser. No. 10/335,078 filed Dec. 31, 2002 and now published as U.S. Patent Application Publication No. US 2004-0125629 A1, which application is hereby incorporated by reference in its entirety; in "NAND Memory Array Incorporating Capacitance Boosting of Channel Regions in Unselected Memory Cells and Method for Operation of Same" by En-Hsing Chen, et al., U.S. application Ser. No. 10/729,831 filed Dec. 5, 2003 and now published as U.S. Patent Application Publication No. US 2004-0145024 A1, which application is hereby incorporated by reference in its entirety; in "Method for Fabricating Programmable Memory Array Structures Incorporating Series-Connected Transistor Strings" by Andrew J. Walker, et al., U.S. application Ser. No. 10/335,089 filed Dec. 31, 2002 and now published as U.S. Patent Application Publication No. US 2004-0124466 A1, which application is hereby incorporated by reference in its entirety; and in "Integrated Circuit Including Memory Array Incorporating Multiple Types of NAND String Structures" by Luca G. Fasoli and Roy E. Scheuerlein, U.S. application Ser. No. 11/026,492 filed on Dec. 30, 2004, which application is hereby incorporated by reference in its entirety.

While many of the embodiments shown herein incorporate a second-level multi-headed decoder having three-transistor decoder heads, other embodiment including two-transistor decoder heads may be advantageous, depending upon voltage levels desired on the second-level decoded outputs.

As should be appreciated, specific exemplary embodiments shown herein have been described in the context of specific numeric examples, such as the number of first-level decoded outputs, the number of second-level decoder heads, the number of second-level decoder outputs, the number of third-level decoder heads, and the number of third-level decoded outputs. Other variations consistent with other design objectives may be implemented using the teachings of this disclosure. In addition, a hierarchical multi-level, multi-headed decoder circuit may include more than two levels of multi-headed decoder circuits.

Most memory arrays are designed having a relatively high degree of uniformity. For example, usually every bit line includes the same number of memory cells. As another example, the number of bit lines, word lines, array blocks, and even memory planes is frequently an integral power of two in number (i.e., $2^N$), for case and efficiency of decode circuitry. But such regularity or consistency is certainly not required for any of the embodiments of the present invention. For example, word line segments on different layers may include different numbers of memory cells, the memory array may include three memory planes, word line segments within the first and last array block may be different in number of memory cells or bit line configuration, and any of many other irregular variations to the usual consistency of memory array design. Unless otherwise explicitly recited in the claims, such usual regularity, even as shown in the embodiments described herein, should not be imported into the meaning of any claim.

It should be appreciated that the designations top, left, bottom, and right are merely convenient descriptive terms for the four sides of a memory array. The word line segments for a block may be implemented as two inter-digitated groups of word line segments oriented horizontally, and the bit lines for a block may be implemented as two inter-digitated groups of bit lines oriented vertically. Each respective group of word lines or bit lines may be served by a respective decoder/driver circuit and a respective sense circuit on one of the four sides of the array. Suitable column circuits are set forth in "Tree Decoder Structure Particularly Well Suited to Interfacing Array Lines Having Extremely Small Layout Pitch," U.S. patent application Ser. No. 10/306,888, filed Nov. 27, 2002, which application is hereby incorporated by reference in its entirety.

Word lines may also be referred to as row lines or X-lines, and bit lines may also be referred to as column lines or Y-lines. The distinction between "word" lines and "bit" lines may carry at least two different connotations to those skilled in the art. When reading a memory array, it is assumed by some practitioners that word lines are "driven" and bit lines are "sensed." In this regard, X-lines (or word lines) are usually contemplated as being connected to the gate terminal of memory cell transistors, or the switch terminal of the memory cell switch device, if present. The Y-lines (or bit lines) are usually contemplated as being connected to a switched terminal of the memory cell (e.g., source/drain terminal). Secondly, the memory organization (e.g., data bus width, number of bits simultaneously read during an operation, etc.) may have some association with viewing one set of the two array lines more aligned with data "bits" rather than data "words." Consequently, the designations herein of X-lines, word lines, and row lines, and of Y-lines, bit lines, and column lines are illustrative of the various embodiments but should not be viewed in a restrictive sense, but rather a more general sense.

As used herein, word lines (e.g., including word line segments) and bit lines usually represent orthogonal array lines, and generally follow a common assumption in the art that word lines are driven and bit lines are sensed, at least during a read operation. Thus, the bit lines of an array may also be referred to as sense lines of the array. No particular implication should be drawn as to word organization by use of such terms. Moreover, as used herein, a "global array line" (e.g., a global word line, a global bit line) is an array line that connects to array line segments in more than one memory block, but no particular inference should be drawn suggesting such a global array line must traverse across an entire memory array or substantially across an entire integrated circuit.

As used herein, a passive element memory array includes a plurality of 2-terminal memory cells, each connected between an associated X-line and an associated Y-line. Such a memory array may be a two-dimensional (planar) array or may be a three-dimensional array having more than one plane of memory cells. Each such memory cell has a non-linear conductivity in which the current in a reverse direction (i.e., from cathode to anode) is lower than the current in a forward direction. Application of a voltage from anode to cathode greater than a programming level changes the conductivity of the memory cell. The conductivity may decrease when the memory cell incorporates a fuse technology, or may increase when the memory cell incorporates an anti-fuse technology. A passive element memory array is not necessarily a one-time programmable (i.e., write once) memory array.

Such passive element memory cells may generally be viewed as having a current steering element directing current in a direction and another component which is capable of changing its state (e.g., a fuse, an antifuse, a capacitor, a resistive element, etc.). The programming state of the memory element can be read by sensing current flow or voltage drop when the memory element is selected.

In various embodiments of the invention described herein, many different memory cell technologies are contemplated for use. Suitable three-dimensional anti-fuse memory cell structures, configurations, and processes include, without limitation, those described in: U.S. Pat. No. 6,034,882 to Johnson, et al, entitled "Vertically Stacked Field Programmable Nonvolatile Memory and Method of Fabrication"; U.S. Pat. No. 6,420,215 to Knall, et al, entitled "Three-Dimensional Memory Array and Method of Fabrication"; U.S. Pat. No. 6,525,953 to Johnson, entitled "Vertically-Stacked, Field Programmable Nonvolatile Memory and Method of Fabrication"; U.S. Patent Application Publication No. 2004-0002184 A1, by Cleeves, entitled "Three Dimensional Memory"; and U.S. patent application Ser. No. 10/326,470 by Herner, et al, filed Dec. 19, 2002, entitled "An Improved Method for Making a High Density Nonvolatile Memory". Each of these enumerated disclosures is incorporated herein by reference in its entirety.

The present invention is contemplated for advantageous use with any of a wide variety of memory cell technologies and memory array configurations, including both traditional single-level memory arrays and multi-level (i.e., three-dimensional) memory arrays, and particularly those having extremely dense X-line or Y-line pitch requirements. In certain embodiments, the memory cells may be comprised of semiconductor materials, as described in U.S. Pat. No. 6,034,882 to Johnson et al., and in U.S. Pat. No. 5,835,396 to Zhang. In certain embodiments, an antifuse memory cell is contemplated. Other types of memory arrays, such as MRAM and organic passive element arrays, can also be used. MRAM (magnetoresistive random access memory) is based on magnetic memory elements, such as a magnetic tunnel junction (MTJ). MRAM technology is described in "A 256 kb 3.0V 1T1MTJ Nonvolatile Magnetoresistive RAM" by Peter K. Naji et al., published in the Digest of Technical Papers of the 2001 IEEE International Solid-State Circuits Conference, ISSCC 2001/Session 7/Technology Directions: Advanced Technologies/7.6, Feb. 6, 2001 and pages 94-95, 404-405 of ISSCC 2001 Visual Supplement. Certain passive element memory cells may be used which incorporate layers of organic materials including at least one layer that has a diode-like characteristic conduction and at least one organic material that changes conductivity with the application of an electric field. U.S. Pat. No. 6,055,180 to Gudensen et al. describes such organic passive element arrays. Memory cells comprising materials such as phase-change materials and amorphous solids can also be used. See U.S. Pat. No. 5,751,012 to Wolstenholme et al., and U.S. Pat. No. 4,646,266 to Ovshinsky et al. In other embodiments, three-terminal memory cells may also be employed, rather than two-terminal passive element memory cells, and multiple X-lines (or row lines) selected to sum currents from more than one memory cell on a selected Y-line (or bit line). Such memory cells include flash EPROM and EEPROM cells, which are well known in the art. Moreover, other memory array configurations having extremely dense X-line and/or Y-line pitch requirements are also contemplated such as, for example, those incorporating thin-film transistor (TFT) EEPROM memory cells, as described in "Dense Arrays and Charge Storage Devices, and Methods for Making Same," by Thomas H. Lee, et al., U.S. Patent Application Publication No. US 2002-0028541 A1, and for those incorporating TFT NAND memory arrays, as described in "Programmable Memory Array Structure Incorporating Series-Connected Transistor Strings and Methods for Fabrication and Operation of Same" by Scheuerlein, et al., U.S. Patent Application Publication No. US 2004-0125629 A1, which applications are hereby incorporated by reference.

The directionality of various array lines in the various figures is merely convenient for ease of description of the two groups of crossing lines in the array. While word lines are usually orthogonal to bit lines, such is not necessarily required. As used herein, an integrated circuit memory array is a monolithic integrated circuit structure, rather than more than one integrated circuit device packaged together or in close proximity.

The block diagrams herein may be described using the terminology of a single node connecting the blocks. Nonetheless, it should be appreciated that, when required by the context, such a "node" may actually represent a pair of nodes for conveying a differential signal, or may represent multiple separate wires (e.g., a bus) for carrying several related signals or for carrying a plurality of signals forming a digital word or other multi-bit signal.

Based upon the teachings of this disclosure, it is expected that one of ordinary skill in the art will be readily able to practice the present invention. The descriptions of the various embodiments provided herein are believed to provide ample insight and details of the present invention to enable one of ordinary skill to practice the invention. Nonetheless, in the interest of clarity, not all of the routine features of the implementations described herein are shown and described. It should, of course, be appreciated that in the development of any such actual implementation, numerous implementation-specific decisions must be made in order to achieve the developer's specific goals, such as compliance with application- and business-related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

For example, decisions as to the number of memory cells within each array or sub-array, the particular configuration chosen for word line and bit line pre-decoder and decoder circuits and bit line sensing circuits, as well as the word organization, are all believed to be typical of the engineering decisions faced by one skilled in the art in practicing this invention in the context of developing a commercially-viable product. As is well known in the art, various row and column decoder circuits are implemented for selecting a memory block, and a word line and bit line within the selected block, based upon address signals and possibly other control signals. Nonetheless, even though a mere routine exercise of engineering effort is believed to be required to practice this invention, such engineering efforts may result in additional inventive efforts, as frequently occurs in the development of demanding, competitive products.

While circuits and physical structures are generally presumed, it is well recognized that in modern semiconductor design and fabrication, physical structures and circuits may be embodied in computer readable descriptive form suitable for use in subsequent design, test or fabrication stages as well as in resultant fabricated semiconductor integrated circuits. Accordingly, claims directed to traditional circuits or structures may, consistent with particular language thereof, read upon computer readable encodings and representations of same, whether embodied in media or combined with suitable reader facilities to allow fabrication, test, or design refinement of the corresponding circuits and/or structures. The invention is contemplated to include circuits, related methods or operation, related methods for making such circuits, and computer-readable medium encodings of such circuits and methods, all as described herein, and as defined in the appended claims. As used herein, a computer-readable medium includes at least disk, tape, or other magnetic, optical, semiconductor (e.g., flash memory cards, ROM), or electronic medium and a network, wireline, wireless or other communications medium. An encoding of a circuit may include circuit schematic information, physical layout information, behavioral simulation information, and/or may include any other encoding from which the circuit may be represented or communicated.

The foregoing details description has described only a few of the many possible implementations of the present invention. For this reason, this detailed description is intended by way of illustration, and not by way of limitations. Variations and modifications of the embodiments disclosed herein may be made based on the description set forth herein, without departing from the scope and spirit of the invention. It is only the following claims, including all equivalents, that are intended to define the scope of this invention. Moreover, the embodiments described above are specifically contemplated to be used alone as well as in various combinations. Accordingly, other embodiments, variations, and improvements not described herein are not necessarily excluded from the scope of the invention.

What is claimed is:

1. A method comprising:
    decoding address information and selecting one or more array lines of a first type in a memory array using a first hierarchical decoder circuit comprising at least two hierarchical levels of multi-headed decoder circuits;
    wherein the decoding and selecting comprises decoding a plurality of address signal inputs using a first-level decoder circuit, and generating a plurality of first-level decoded outputs thereof;

coupling each respective first-level decoded output to a respective one of a plurality of second-level multi-headed decoder circuits, each providing a respective plurality of second-level decoded outputs; and coupling each respective second-level decoded output to a respective one of a plurality of third-level multi-headed decoder circuits, each providing a respective plurality of third-level decoded outputs coupled to the memory array.

2. The method as recited in claim 1 wherein the memory array comprises a three-dimensional memory array having at least two memory planes, said memory array comprising:

array lines of first and second types coupled to memory cells;

a respective plurality of array lines of the first type on each of at least one array line layer; and a respective plurality of array lines of the second type on each of at least one array line layer.

3. The method as recited in claim 1 wherein each respective one of the second-level multi-headed decoder circuits comprises a respective plurality of second-level driver circuits, each second-level driver circuit comprising:

an input coupled to the respective one of the first-level decoded outputs; and an output coupled to the corresponding one of the respective plurality of second-level decoded outputs;

each second-level driver circuit for coupling its output to an associated one of a plurality of first bias nodes at times when the first-level decoded output coupled to its input is selected, and otherwise for coupling its output to an associated one of a plurality of second bias nodes.

4. The method as recited in claim 3 wherein the first hierarchical decoder circuit further comprises:

a first plurality of second-level bias circuits for respectively generating a suitable condition on the plurality of first bias nodes; and a second plurality of second-level bias circuits for respectively generating a suitable condition on the plurality of second bias nodes;

and wherein:

the suitable condition on at least one of the first bias nodes is at times a selected second-level decoded output bias condition; and the suitable condition on at least another one of the first bias nodes is at times an unselected second-level decoded output bias condition.

5. The method as recited in claim 4 wherein the second-level driver circuits respectively comprise:

a first transistor circuit for coupling the output of the driver circuit to the associated one of the plurality of first bias nodes when the first-level decoded output coupled to the input is selected; and a second transistor circuit for coupling the output of the driver circuit to the associated one of the plurality of second bias nodes when the first-level decoded output coupled to the input is unselected;

wherein the first transistor circuit comprises two parallel-connected transistor devices of opposite conductivity type.

6. The method as recited in claim 4 wherein the second-level driver circuits respectively comprise:

a first transistor circuit for coupling the output of the driver circuit to the associated one of the plurality of first bias nodes when the first-level decoded output coupled to the input is selected; and a second transistor circuit for coupling the output of the driver circuit to the associated one of the plurality of second bias nodes when the first-level decoded output coupled to the input is unselected;

wherein the second transistor circuit comprises at least two parallel-connected transistor devices controlled by separate signals.

7. The method as recited in claim 3 wherein each respective one of the third-level multi-headed decoder circuits comprises a respective plurality of third-level driver circuits, each third-level driver circuit comprising:

an input coupled to the respective one of the second-level decoded outputs; and an output coupled to the corresponding one of the respective plurality of third-level decoded outputs;

each third-level driver circuit for coupling its output to an associated one of a plurality of third bus lines at times when the second-level decoded output coupled to its input is selected, and otherwise for coupling its output to an associated one of a plurality of fourth bias nodes.

8. The method as recited in claim 7 wherein the first hierarchical decoder circuit further comprises:

a first plurality of third-level bias circuits for respectively generating at times a suitable condition on the plurality of third bus lines; and a second plurality of third-level bias circuits for respectively generating a suitable condition on the plurality of fourth bias nodes;

wherein:

the suitable condition on at least one of the third bus lines is at times a selected third-level decoded output bias condition; and the suitable condition on at least another one of the third bias nodes is at times an unselected third-level decoded output bias condition.

9. The method as recited in claim 8 wherein the third-level driver circuits respectively comprise:

a third transistor circuit for coupling the output of the third-level driver circuit to the associated one of the plurality of third bus lines when the second-level decoded output coupled to the input is selected; and a fourth transistor circuit for coupling the output of the third-level driver circuit to the associated one of the plurality of fourth bias nodes when the second-level decoded output coupled to the input is unselected;

wherein at least one of the third transistor circuit and fourth transistor circuit comprises at least two parallel-connected transistor devices of opposite conductivity type and controlled by separate signals.

10. The method as recited in claim 1 wherein the second-level decoded outputs traverse across substantially the entire memory array.

11. The method as recited in claim 1 wherein the second-level decoded outputs are driven to a voltage above VDD for at least one of a selected and unselected bias condition.

12. The method as recited in claim 1 wherein:

the memory array comprises a three-dimensional array having at least two memory planes disposed above a substrate, and further having a respective plurality of array lines of the first type on at least one array line layer, and having a respective plurality of array lines of the second type on at least one array line layer; and at least one plurality of the second-level and third-level multi-headed decoder circuits is disposed substantially within the lateral extent of the memory array.

13. The method as recited in claim 12 wherein the plurality of third-level multi-headed decoder circuits is disposed substantially outside the memory array.

14. The method as recited in claim 12 wherein:
the plurality of second-level multi-headed decoder circuits is disposed substantially outside the memory array;
the third-level decoded outputs comprise bit lines in the memory array, each coupled to an associated plurality of memory cells in the memory array; and
the plurality of third bus lines are respectively coupled to a respective read/write bus.

15. The method as recited in claim 12 wherein:
the plurality of second-level multi-headed decoder circuits are disposed substantially outside the memory array; and
the plurality of third-level multi-headed decoder circuits are disposed substantially beneath the memory array.

16. The method as recited in claim 3 wherein:
the plurality of second-level driver circuits within a second-level multi-headed decoder circuit is arranged in groups of such second-level driver circuits, individual second-level driver circuits within a group being respectively coupled to a respective one of the plurality of first bias lines, but together coupled to a respective one of the plurality of second bias lines shared by the group.

17. A method for making a product incorporating a memory array, said method comprising:
providing a memory array comprising array lines of first and second types coupled to memory cells;
providing a first hierarchical decoder circuit for decoding address information and selecting one or more array lines of the first type, said first hierarchical decoder circuit comprising at least two hierarchical levels of multi-headed decoder circuits;
wherein said providing a first hierarchical decoder circuit comprises
providing a first-level decoder circuit for decoding a plurality of address signal inputs and generating a plurality of first-level decoded outputs;
providing a plurality of second-level multi-headed decoder circuits, each respective one coupled to a respective first-level decoded output, each for providing a respective plurality of second-level decoded outputs; and
providing a plurality of third-level multi-headed decoder circuits, each respective one coupled to a respective second-level decoded output, each for providing a respective plurality of third-level decoded outputs coupled to the memory array.

18. The method as recited in claim 17 wherein the memory array comprises a three-dimensional memory array having at least two memory planes, said memory array comprising:
array lines of first and second types coupled to memory cells;
a respective plurality of array lines of the first type on each of at least one array line layer; and
a respective plurality of array lines of the second type on each of at least one array line layer.

19. The method as recited in claim 17 wherein each respective one of the second-level multi-headed decoder circuits comprises a respective plurality of second-level driver circuits, each second-level driver circuit comprising:

an input coupled to the respective one of the first-level decoded outputs; and
an output coupled to the corresponding one of the respective plurality of second-level decoded outputs;
each second-level driver circuit for coupling its output to an associated one of a plurality of first bias nodes at times when the first-level decoded output coupled to its input is selected, and otherwise for coupling its output to an associated one of a plurality of second bias nodes.

20. The method as recited in claim 19 wherein the first hierarchical decoder circuit further comprises:
a first plurality of second-level bias circuits for respectively generating a suitable condition on the plurality of first bias nodes; and
a second plurality of second-level bias circuits for respectively generating a suitable condition on the plurality of second bias nodes;
and wherein:
the suitable condition on at least one of the first bias nodes is at times a selected second-level decoded output bias condition; and
the suitable condition on at least another one of the first bias nodes is at times an unselected second-level decoded output bias condition.

21. The method as recited in claim 17 wherein the second-level decoded outputs traverse across substantially the entire memory array.

22. The method as recited in claim 17 wherein the second-level decoded outputs are driven to a voltage above VDD for at least one of a selected and unselected bias condition.

23. The method as recited in claim 17 wherein:
the memory array comprises a thee-dimensional array having at least two memory planes disposed above a substrate, and further having a respective plurality of array lines of the first type on at least one array line layer, and having a respective plurality of array lines of the second type on at least one array line layer; and
at least one plurality of the second-level and third-level multi-headed decoder circuits is disposed substantially within the lateral extent of the memory array.

24. The method as recited in claim 23 wherein:
the plurality of second-level multi-headed decoder circuits is disposed substantially outside the memory array;
the third-level decoded outputs comprise bit lines in the memory array, each coupled to an associated plurality of memory cells in the memory array; and
the plurality of third bus lines are respectively coupled to a respective read/write bus.

25. The method as recited in claim 23 wherein:
the plurality of second-level multi-headed decoder circuits are disposed substantially outside the memory array; and
the plurality of third-level multi-headed decoder circuits are disposed substantially beneath the memory array.

26. The method as recited in claim 19 wherein:
the plurality of second-level driver circuits within a second-level multi-headed decoder circuit is arranged in groups of such second-level driver circuits, individual second-level driver circuits within a group being respectively coupled to a respective one of the plurality of first bias lines, but together coupled to a respective one of the plurality of second bias lines shared by the group.

* * * * *